(12) United States Patent
Huang et al.

(10) Patent No.: US 12,417,992 B2
(45) Date of Patent: Sep. 16, 2025

(54) CHIP STRUCTURE WITH CONDUCTIVE PILLAR AND METHOD FOR FORMING THE SAME

(71) Applicant: Taiwan Semiconductor Manufacturing Company, Ltd., Hsinchu (TW)

(72) Inventors: Shan-Yu Huang, Zhubei (TW); Ming-Da Cheng, Taoyuan (TW); Hsiao-Wen Chung, Taipei (TW); Ching-Wen Hsiao, Hsinchu (TW); Li-Chun Hung, Hsinchu (TW); Yuan-Yao Chang, Kaohsiung (TW); Meng-Hsiu Hsieh, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 162 days.

(21) Appl. No.: 18/302,228

(22) Filed: Apr. 18, 2023

(65) Prior Publication Data

US 2023/0253356 A1 Aug. 10, 2023

Related U.S. Application Data

(63) Continuation of application No. 17/460,937, filed on Aug. 30, 2021, now Pat. No. 11,688,708.

(51) Int. Cl.
*H01L 23/00* (2006.01)
*H01L 23/522* (2006.01)

(52) U.S. Cl.
CPC .......... *H01L 24/13* (2013.01); *H01L 23/5226* (2013.01); *H01L 24/11* (2013.01);
(Continued)

(58) Field of Classification Search
CPC ....... H01L 24/13; H01L 23/5226; H01L 24/11
See application file for complete search history.

(56) References Cited

U.S. PATENT DOCUMENTS 7,253,531 B1 * 8/2007 Huang .................... H01L 24/05
257/784
8,723,325 B2 * 5/2014 Chen ...................... H01L 24/03
438/614
(Continued)

FOREIGN PATENT DOCUMENTS

CN 113628976 A * 11/2021 .............. H01L 24/11
CN 114512465 A * 5/2022 ......... H01L 21/4853
(Continued)

OTHER PUBLICATIONS

Chinese language office action dated May 5, 2023, issued in application No. TW 111125298.
(Continued)

*Primary Examiner* — Laura M Menz
(74) *Attorney, Agent, or Firm* — McClure, Qualey & Rodack, LLP

(57) ABSTRACT

A chip structure is provided. The chip structure includes a substrate. The chip structure includes a first conductive line over the substrate. The chip structure includes an insulating layer over the substrate and the first conductive line. The chip structure includes a conductive pillar over and passing through the insulating layer. The conductive pillar is formed in one piece, the conductive pillar is in direct contact with the first conductive line, and a first sidewall of the first conductive line extends across a second sidewall of the conductive pillar in a top view of the first conductive line and the conductive pillar. The chip structure includes a solder bump on the conductive pillar. The solder bump is in direct contact with the conductive pillar.

20 Claims, 30 Drawing Sheets

(52) U.S. Cl.
  CPC .............. *H01L 2224/1147* (2013.01); *H01L 2224/13015* (2013.01); *H01L 2224/13018* (2013.01); *H01L 2224/13082* (2013.01)

(56) References Cited

U.S. PATENT DOCUMENTS

| | | | |
|---|---|---|---|
| 9,059,159 B2 | 6/2015 | Topacio et al. | |
| 9,716,071 B2 | 7/2017 | Ryu et al. | |
| 9,768,135 B2 * | 9/2017 | Yao | H01L 24/13 |
| 9,786,618 B2 * | 10/2017 | Huang | H01L 23/5226 |
| 10,269,703 B2 * | 4/2019 | Ku | H10D 1/20 |
| 10,269,737 B2 * | 4/2019 | Huang | H01L 24/02 |
| 10,446,522 B2 * | 10/2019 | Lin | H01L 25/0657 |
| 10,879,206 B1 * | 12/2020 | Wu | H01L 24/13 |
| 10,964,591 B2 * | 3/2021 | Hsieh | H01L 24/20 |
| 11,043,482 B2 * | 6/2021 | Chen | H01L 24/19 |
| 11,145,562 B2 * | 10/2021 | Chang | H01L 23/3128 |
| 11,195,816 B2 * | 12/2021 | Yu | H01L 25/50 |
| 11,217,482 B2 * | 1/2022 | Huang | H01L 21/762 |
| 11,302,649 B2 * | 4/2022 | Huang | H01L 23/5225 |
| 11,322,450 B2 * | 5/2022 | Hu | H01L 21/4857 |
| 11,373,968 B2 * | 6/2022 | Pang | H01L 24/16 |
| 11,444,021 B2 * | 9/2022 | Chen | H01L 23/5226 |
| 11,651,994 B2 * | 5/2023 | Hsieh | H01L 23/3107 |
| | | | 438/127 |
| 11,908,790 B2 * | 2/2024 | Yang | H01L 21/76877 |
| 11,955,423 B2 * | 4/2024 | Yang | H01L 21/76885 |
| 12,015,002 B2 * | 6/2024 | Huang | H01L 24/16 |
| 2010/0187687 A1 * | 7/2010 | Liu | H01L 24/05 |
| | | | 257/738 |
| 2010/0283149 A1 * | 11/2010 | Chen | H01L 24/03 |
| | | | 257/737 |
| 2011/0204510 A1 | 8/2011 | Lin et al. | |
| 2011/0254165 A1 * | 10/2011 | Muranaka | H01L 23/53295 |
| | | | 257/E23.161 |
| 2012/0074571 A1 * | 3/2012 | Lavoie | H01L 23/53238 |
| | | | 257/E23.161 |
| 2013/0186944 A1 * | 7/2013 | Haba | H01L 21/4853 |
| | | | 228/180.1 |
| 2016/0118336 A1 * | 4/2016 | Yang | H01L 21/76885 |
| | | | 257/288 |
| 2016/0307862 A1 * | 10/2016 | Lin | H01L 24/20 |
| 2017/0141056 A1 * | 5/2017 | Huang | H01L 24/14 |
| 2018/0033750 A1 * | 2/2018 | Huang | H01L 24/13 |
| 2018/0151493 A1 * | 5/2018 | Ku | H10D 1/20 |
| 2018/0174981 A1 * | 6/2018 | Lu | H01L 23/13 |
| 2018/0233484 A1 | 8/2018 | Lin et al. | |
| 2019/0006289 A1 * | 1/2019 | Huang | H01L 24/02 |
| 2019/0131287 A1 * | 5/2019 | Huang | H01L 21/50 |
| 2020/0013740 A1 | 1/2020 | Bae et al. | |
| 2020/0035629 A1 | 1/2020 | Wang | |
| 2020/0075540 A1 * | 3/2020 | Lu | H01L 23/49822 |
| 2020/0105668 A1 * | 4/2020 | Ho | H01L 21/7685 |
| 2020/0185330 A1 * | 6/2020 | Yu | H01L 24/24 |
| 2020/0203299 A1 * | 6/2020 | Huang | H01L 24/94 |
| 2020/0294948 A1 | 9/2020 | Lin et al. | |
| 2020/0343206 A1 * | 10/2020 | Pang | H01L 24/03 |
| 2021/0043591 A1 * | 2/2021 | Choi | H01L 24/11 |
| 2021/0217703 A1 | 7/2021 | Chuang et al. | |
| 2021/0366877 A1 * | 11/2021 | Wu | H01L 23/5384 |
| 2021/0375769 A1 * | 12/2021 | Cheng | H01L 24/16 |
| 2022/0013461 A1 * | 1/2022 | Lin | H01L 21/4857 |
| 2022/0093560 A1 * | 3/2022 | Yu | H01L 25/50 |
| 2022/0102165 A1 * | 3/2022 | Shih | H01L 23/5384 |
| 2022/0115349 A1 * | 4/2022 | Chu | H01L 23/5226 |
| 2022/0157743 A1 * | 5/2022 | Mao | H01L 23/3128 |
| 2022/0199461 A1 * | 6/2022 | Yu | H01L 25/50 |
| 2022/0216143 A1 * | 7/2022 | Yang | H01L 24/14 |
| 2022/0270893 A1 * | 8/2022 | Lin | H01L 23/36 |
| 2022/0367347 A1 * | 11/2022 | Yang | H01L 23/5226 |
| 2023/0253356 A1 * | 8/2023 | Huang | H01L 24/13 |
| | | | 257/737 |
| 2024/0332235 A1 * | 10/2024 | Huang | H01L 24/11 |

FOREIGN PATENT DOCUMENTS

| | | |
|---|---|---|
| TW | 200743199 A | 11/2007 |
| TW | 200837918 A | 9/2008 |
| TW | 201017844 A | 5/2010 |
| TW | 201133737 A | 10/2011 |
| TW | 201944503 A | 11/2019 |
| TW | 202008520 A | 2/2020 |

OTHER PUBLICATIONS

Chinese language office action dated Sep. 7, 2023, issued in application No. TW 111110334.

Non-Final Office Action dated Apr. 12, 2023, issued in application No. U.S. Appl. No. 17/460,906.

* cited by examiner

CHIP STRUCTURE WITH CONDUCTIVE PILLAR AND METHOD FOR FORMING THE SAME

CROSS REFERENCE

This application is a Continuation of U.S. application Ser. No. 17/460,937, filed on Aug. 30, 2021 (now U.S. Pat. No. 11,688,708), the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1G-1 is a top view of the chip structure of FIG. 1G, in accordance with some embodiments.

FIG. 1L-1 is a top view of the chip structure of FIG. 1L, in accordance with some embodiments.

DETAILED DESCRIPTION

Figure 1A:
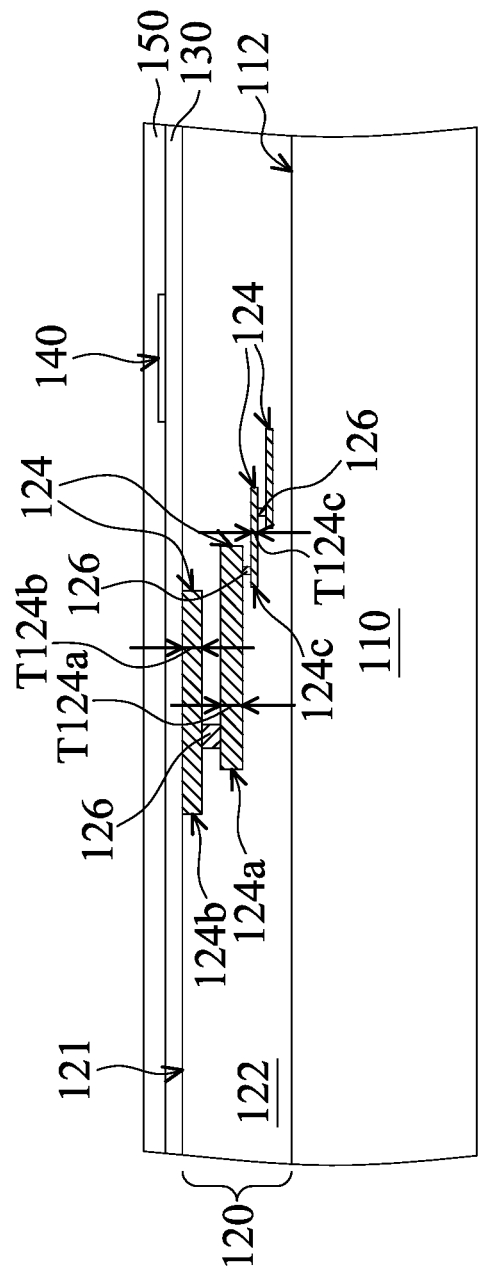
FIGS. 1A-1L are cross-sectional views of various stages of a process for forming a chip structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. The term "substantially" may be varied in different technologies and be in the deviation range understood by the skilled in the art. For example, the term "substantially" may also relate to 90% of what is specified or higher, such as 95% of what is specified or higher, especially 99% of what is specified or higher, including 100% of what is specified, though the present invention is not limited thereto. Furthermore, terms such as "substantially parallel" or "substantially perpendicular" may be interpreted as not to exclude insignificant deviation from the specified arrangement and may include for example deviations of up to 10°. The word "substantially" does not exclude "completely" e.g. a composition which is "substantially free" from Y may be completely free from Y.

The term "about" may be varied in different technologies and be in the deviation range understood by the skilled in the art. The term "about" in conjunction with a specific distance or size is to be interpreted so as not to exclude insignificant deviation from the specified distance or size. For example, the term "about" may include deviations of up to 10% of what is specified, though the present invention is not limited thereto. The term "about" in relation to a numerical value x may mean x±5 or 10% of what is specified, though the present invention is not limited thereto.

Some embodiments of the disclosure are described. Additional operations can be provided before, during, and/or after the stages described in these embodiments. Some of the stages that are described can be replaced or eliminated for different embodiments. Additional features can be added to the chip structure. Some of the features described below can be replaced or eliminated for different embodiments. Although some embodiments are discussed with operations performed in a particular order, these operations may be performed in another logical order.

FIGS. 1A-1L are cross-sectional views of various stages of a process for forming a chip structure, in accordance with some embodiments. As shown in FIG. 1A, a substrate 110 is provided, in accordance with some embodiments. The substrate 110 includes, for example, a semiconductor wafer (such as a silicon wafer) or a portion of a semiconductor wafer.

In some embodiments, the substrate 110 is made of an elementary semiconductor material including silicon or germanium in a single crystal structure, a polycrystal structure, or an amorphous structure. In some other embodiments, the substrate 110 is made of a compound semiconductor, such as silicon carbide, gallium arsenide, gallium phosphide, indium phosphide, indium arsenide, an alloy semiconductor, such as SiGe or GaAsP, or a combination thereof. The substrate 110 may also include multi-layer semiconductors, semiconductor on insulator (SOI) (such as silicon on insulator or germanium on insulator), or a combination thereof.

In some embodiments, various device elements are formed in and/or over the substrate 110. The device elements are not shown in figures for the purpose of simplicity and clarity. Examples of the various device elements include active devices, passive devices, other suitable elements, or a combination thereof. The active devices may include transistors or diodes (not shown) formed at a surface of the substrate 110. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 110. The isolation features are used to surround active regions and electrically isolate various device elements formed in and/or over the substrate 110 in the active regions. In some embodiments, the isolation features include shallow trench isolation (STI) features, local oxidation of silicon (LOCOS) features, other suitable isolation features, or a combination thereof.

As shown in FIG. 1A, an interconnect structure 120 is formed over the substrate 110, in accordance with some embodiments. The interconnect structure 120 includes a dielectric structure 122, wiring layers 124, and conductive vias 126, in accordance with some embodiments. The dielectric structure 122 is formed over a surface 112 of the substrate 110, in accordance with some embodiments.

The wiring layers 124 and the conductive vias 126 are formed in the dielectric structure 122, in accordance with some embodiments. The conductive vias 126 are electrically connected between different wiring layers 124 and between the wiring layer 124 and the aforementioned device elements, in accordance with some embodiments.

The wiring layers 124 include top metal wiring layers 124a and 124b and wiring layers 124c, in accordance with some embodiments. Both of the top metal wiring layers 124a and 124b are thicker than the wiring layers 124c, in accordance with some embodiments.

The top metal wiring layer 124a has a thickness T124a ranging from about 0.6 μm to about 1 μm, in accordance with some embodiments. The top metal wiring layer 124b has a thickness T124b ranging from about 0.6 μm to about 1 μm, in accordance with some embodiments. The wiring layer 124c has a thickness T124c ranging from about 0.04 μm to about 0.5 μm, in accordance with some embodiments.

Since both of the top metal wiring layers 124a and 124b are thicker than the wiring layers 124c, the top metal wiring layers 124a and 124b are able to withstand greater bonding stress in a subsequent bonding process than the wiring layers 124c and able to suppress stress migration to the wiring layers 124c therebelow, in accordance with some embodiments.

In some embodiments, a ratio of an area of a top surface of the top metal wiring layer 124a or 124b to an area of a top surface 121 of the interconnect structure 120 is substantially equal to or greater than 20%. The ratio is also referred to as a density of the top metal wiring layer 124a or 124b, in accordance with some embodiments. If the ratio (i.e. the density of the top metal wiring layer 124a or 124b) is less than 20%, the top metal wiring layers 124a and 124b may be unable to suppress stress migration to the wiring layers 124c therebelow, in accordance with some embodiments.

The dielectric structure 122 is made of an oxide-containing material (e.g. silicon oxide or undoped silicate glass) or another suitable insulating material, in accordance with some embodiments. The wiring layers 124 and the conductive vias 126 are made of conductive materials such as metal (e.g., aluminum, copper or tungsten) or alloys thereof, in accordance with some embodiments.

As shown in FIG. 1A, a passivation layer 130 is formed over the interconnect structure 120, in accordance with some embodiments. The passivation layer 130 is used as an anti-acid layer to prevent acid (used in subsequent processes) from penetrating into the interconnect structure 120, in accordance with some embodiments.

The passivation layer 130 is made of a dielectric material, such as an oxide-containing material (e.g., silicon oxide or undoped silicate glass (USG)), in accordance with some embodiments. The passivation layer 130 is formed using a deposition process (e.g., a chemical vapor deposition process or a physical vapor deposition process), in accordance with some embodiments.

As shown in FIG. 1A, a metal-insulator-metal (MIM) capacitor 140 is formed over the passivation layer 130, in accordance with some embodiments. The MIM capacitor 140 includes a bottom metal layer (not shown), an insulating layer (not shown), and a top metal layer (not shown), in accordance with some embodiments. The insulating layer is sandwiched between the bottom metal layer and the top metal layer, in accordance with some embodiments.

The bottom metal layer and the top metal layer are made of titanium (Ti), titanium nitride (TiN), tantalum (Ta), tantalum nitride (TaN), copper (Cu), copper alloy, aluminum (Al), aluminum (Al) alloy, copper aluminum alloy (AlCu), tungsten (W), or tungsten (W) alloy, in accordance with some embodiments. The bottom metal layer and the top metal layer are formed by a procedure including depositing, photolithography, and etching processes.

The deposition processes include chemical vapor deposition (CVD), physical vapor deposition (PVD), atomic layer deposition (ALD), or applicable methods. The photolithography processes include photoresist coating (e.g., spin-on coating), soft baking, mask aligning, exposure, post-exposure baking, developing the photoresist, rinsing, and drying (e.g., hard baking), in accordance with some embodiments. The etching processes include dry etching, wet etching, and/or other etching methods.

The insulating layer is made of dielectric materials, such as silicon oxide, silicon nitride or silicon glass. In some embodiments, the insulating layer is formed by a chemical vapor deposition (CVD) process or physical vapor deposition (PVD) process.

As shown in FIG. 1A, a passivation layer 150 is formed over the passivation layer 130 and the MIM capacitor 140, in accordance with some embodiments. The passivation layer 150 is used as a waterproof layer to prevent water from penetrating into the interconnect structure 120, in accordance with some embodiments.

The passivation layer 150 is made of a dielectric material, such as a nitride-containing material (e.g., silicon nitride or silicon oxynitride), in accordance with some embodiments. The passivation layer 150 is formed using a deposition process (e.g., a chemical vapor deposition process or a physical vapor deposition process), in accordance with some embodiments.

Figure 1B:
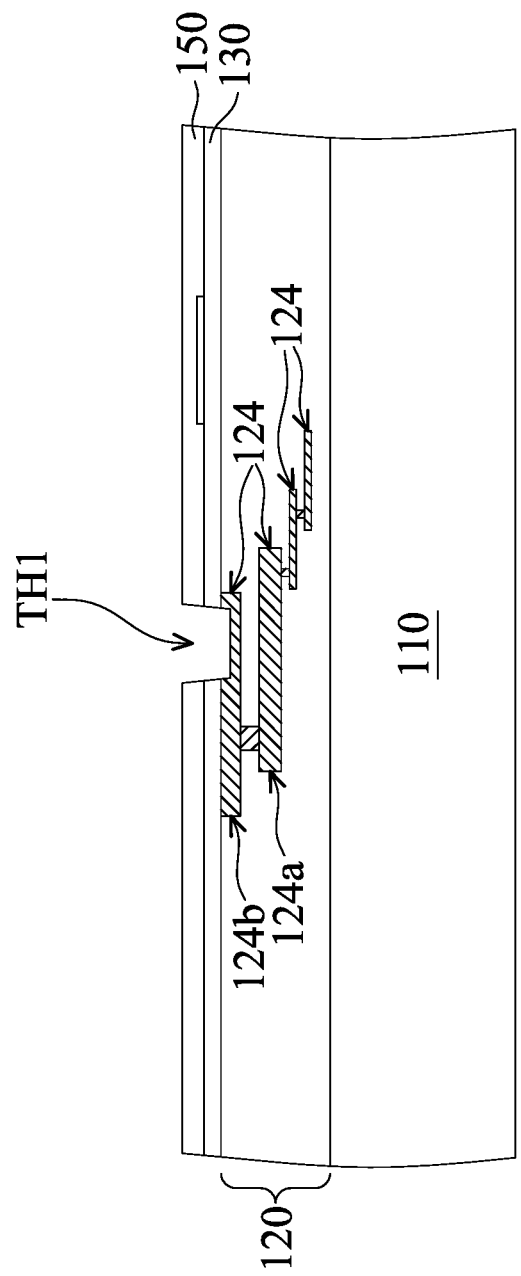

As shown in FIG. 1B, portions of the passivation layers 130 and 150 are removed to form a through hole TH1 in the passivation layers 130 and 150, in accordance with some embodiments. In some embodiments, the through hole TH1 further extends into the top metal wiring layer 124*b*. The through hole TH1 exposes a portion of the top metal wiring layer 124*b*, in accordance with some embodiments. The removal process includes a photolithography process and an etching process, such as a dry etching process, in accordance with some embodiments.

Thereafter, a barrier layer (not shown) is conformally formed over the passivation layers 130 and 150 and in the through hole TH1, in accordance with some embodiments. The barrier layer is made of nitrides such as tantalum nitride (TaN), in accordance with some embodiments. The barrier layer is formed using a deposition process, such as a physical vapor deposition process, in accordance with some embodiments.

Figure 1C:
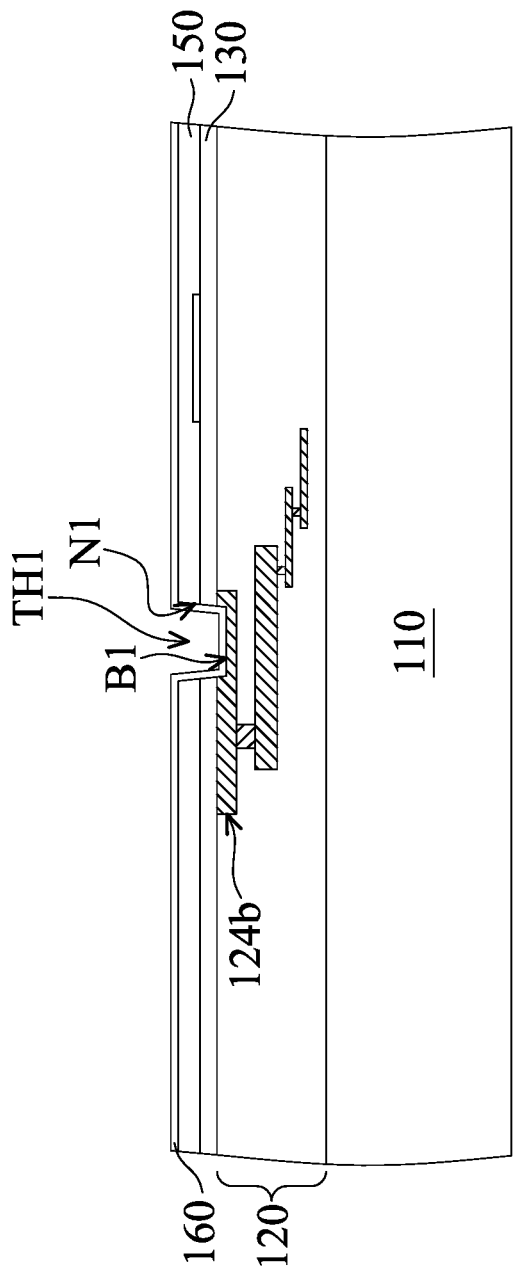

As shown in FIG. 1C, a seed layer 160 is conformally formed over the barrier layer (not shown), in accordance with some embodiments. In some embodiments, the barrier layer is not formed. The seed layer 160 conformally covers a bottom surface B1 and inner walls N1 of the through hole TH1, in accordance with some embodiments.

The seed layer 160 is made of a conductive material, such as metal (e.g., copper, aluminum, gold, silver, or tungsten) or alloys thereof, in accordance with some embodiments. The seed layer 160 is formed using a deposition process, such as a physical vapor deposition process, in accordance with some embodiments.

Figure 1D:
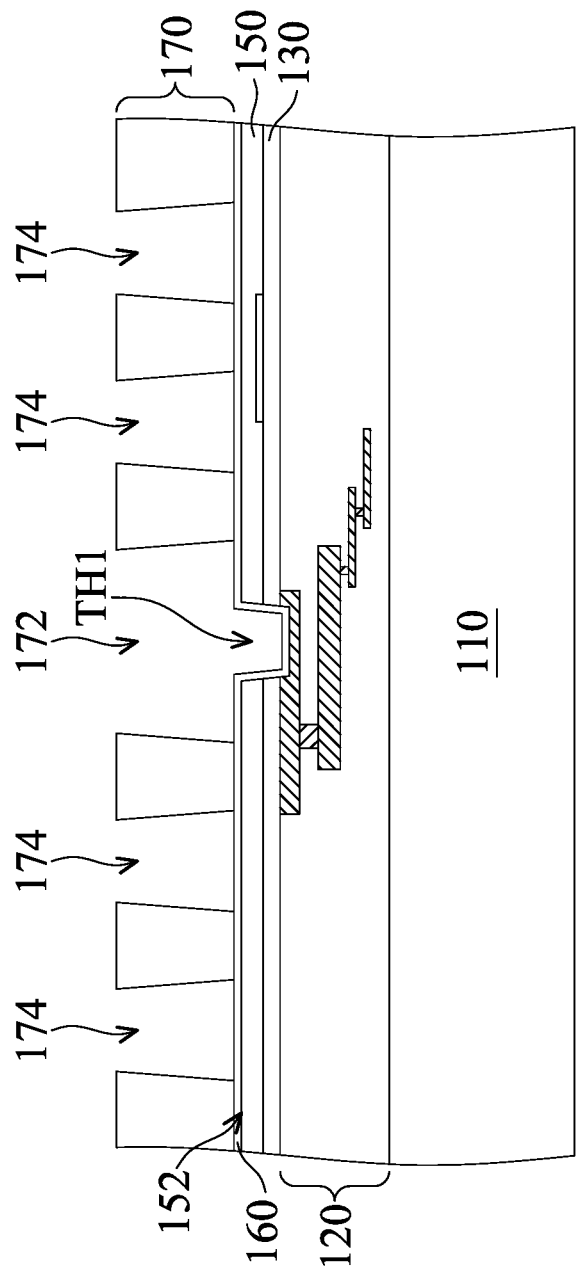

As shown in FIG. 1D, a mask layer 170 is formed over the seed layer 160, in accordance with some embodiments. The mask layer 170 has trenches 172 and 174 exposing portions of the seed layer 160, in accordance with some embodiments. The trench 172 exposes a portion of the seed layer 160 in the through hole TH1 and a portion of the seed layer 160 over a top surface 152 of the passivation layer 150, in accordance with some embodiments. The trench 172 is wider than the trench 174, in accordance with some embodiments.

The trenches 172 and 174 have a trapezoid-like shape, which has a narrow top and a wide bottom, and therefore conductive lines subsequently formed therein have a trapezoid-like shape as well, which prevents the conductive lines from collapsing and therefore improves the stability of the conductive lines, in accordance with some embodiments. The mask layer 170 is made of a polymer material, such as a photoresist material, in accordance with some embodiments.

After the mask layer 170 is formed, a descum process is performed over the seed layer 160 exposed by the trenches 172 and 174 to remove the residues thereover, in accordance with some embodiments. The descum process includes an etching process such as a plasma etching process, in accordance with some embodiments.

Figure 1E:
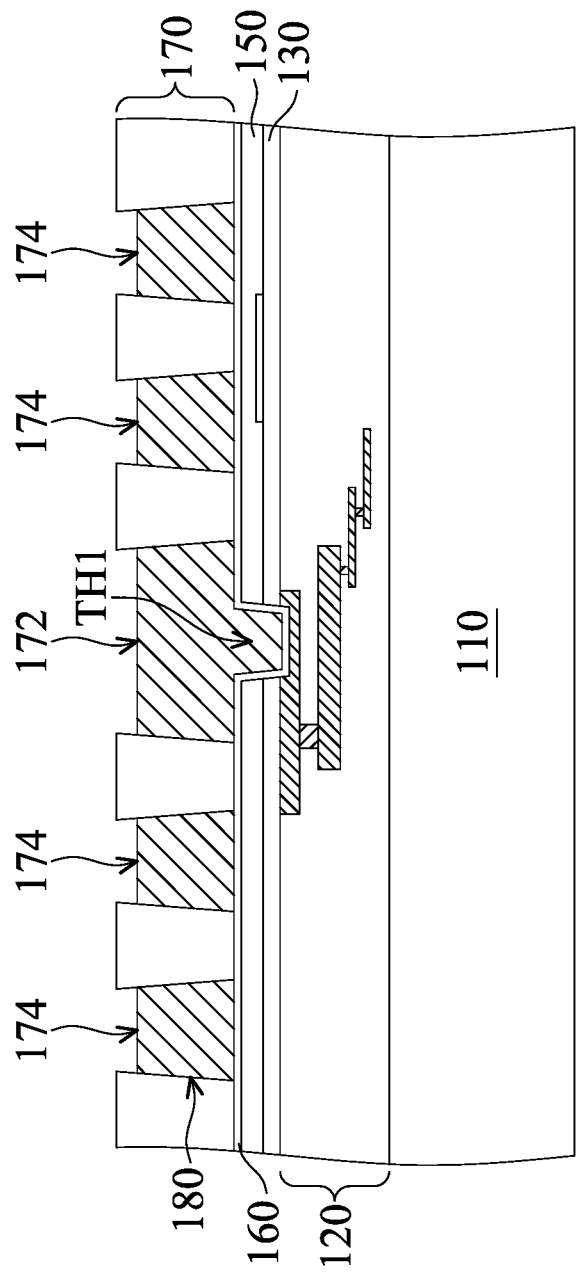

As shown in FIG. 1E, a conductive layer 180 is formed over the seed layer 160 exposed by the trenches 172 and 174, in accordance with some embodiments. The conductive layer 180 is made of a conductive material, such as metal (e.g., copper) or alloys thereof, in accordance with some embodiments. The conductive layer 180 is formed by a plating process, such as an electroplating process, in accordance with some embodiments.

Figure 1F:
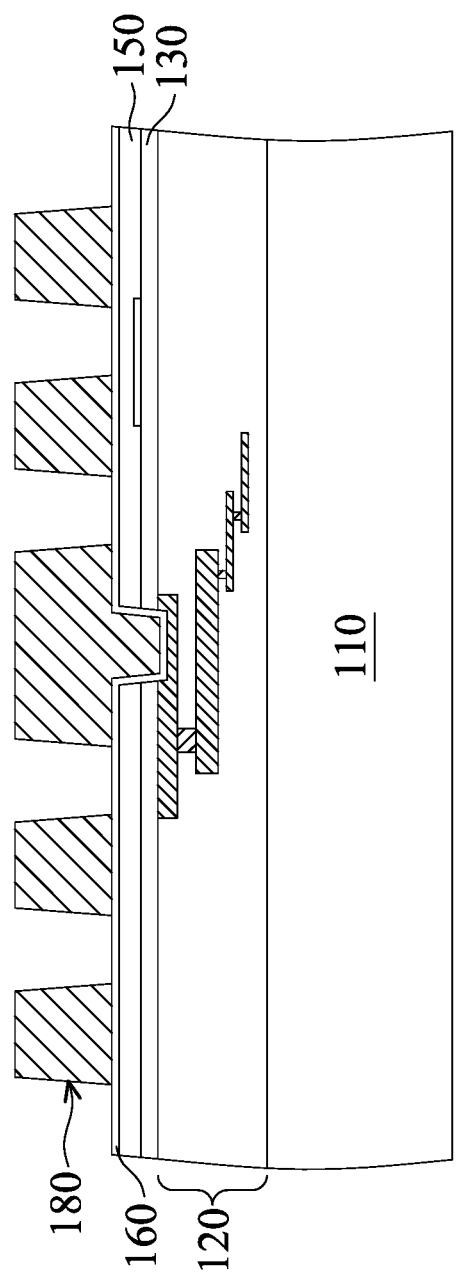
Figure 1G:
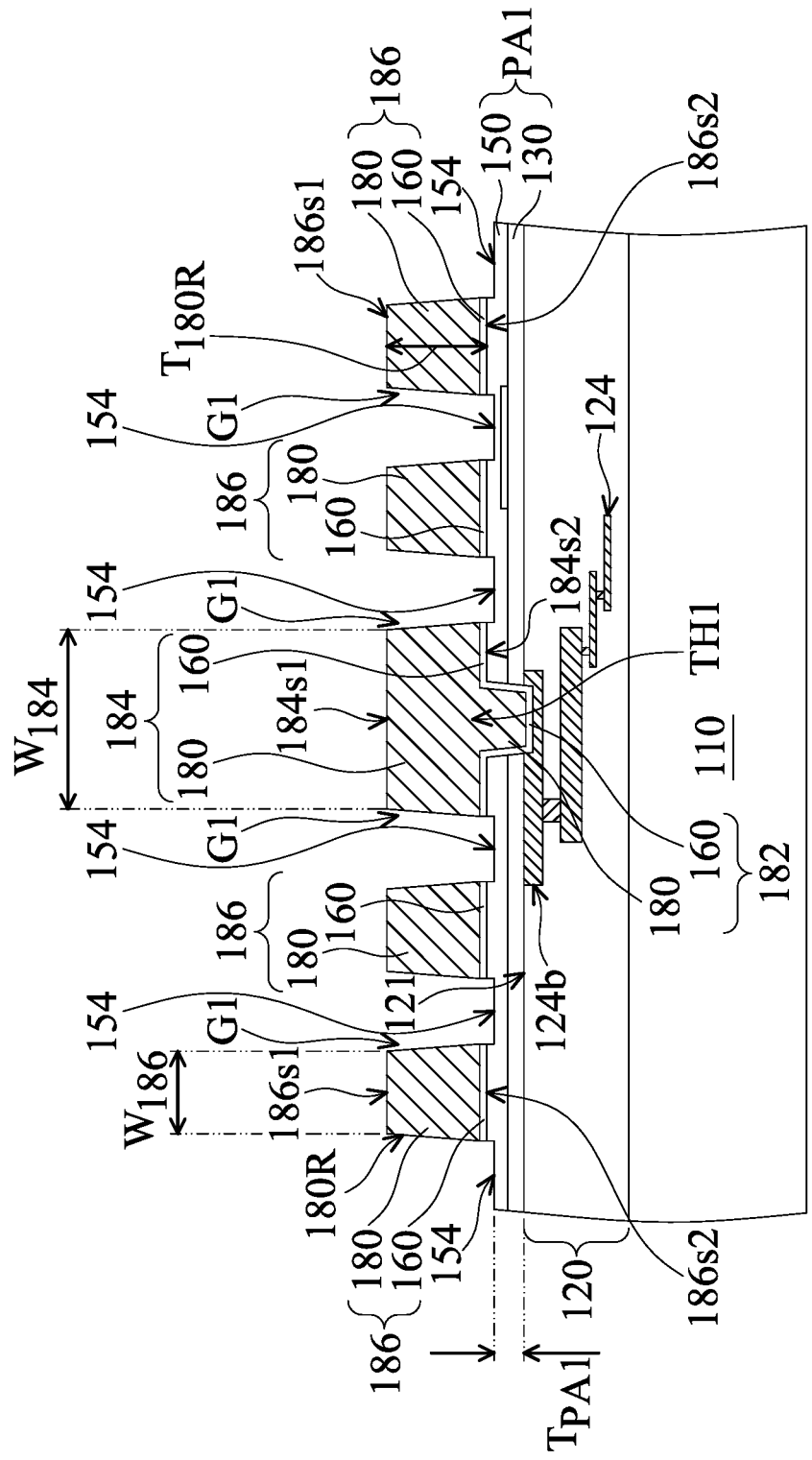

As shown in FIG. 1F, the mask layer 170 is removed, in accordance with some embodiments. As shown in FIGS. 1E and 1G, the seed layer 160 originally under the mask layer 170 is removed, in accordance with some embodiments. The removal process includes an etching process such as a wet etching process, in accordance with some embodiments. Thereafter, the barrier layer (not shown), which is not covered by the conductive layer 180, is removed, in accordance with some embodiments. The removal process includes an etching process such as a dry etching process, in accordance with some embodiments.

The removal process for removing the seed layer 160 originally under the mask layer 170 may further removes portions of the passivation layer 150, which are not covered by the conductive layer 180. Therefore, recesses 154 are formed in the passivation layer 150, in accordance with some embodiments. The passivation layers 130 and 150 together form a first passivation layer PA1, in accordance with some embodiments. The first passivation layer PA1 has a thickness $T_{PA1}$ ranging from about 0.2 μm to about 0.8 μm, in accordance with some embodiments.

Figures 1, 1G:
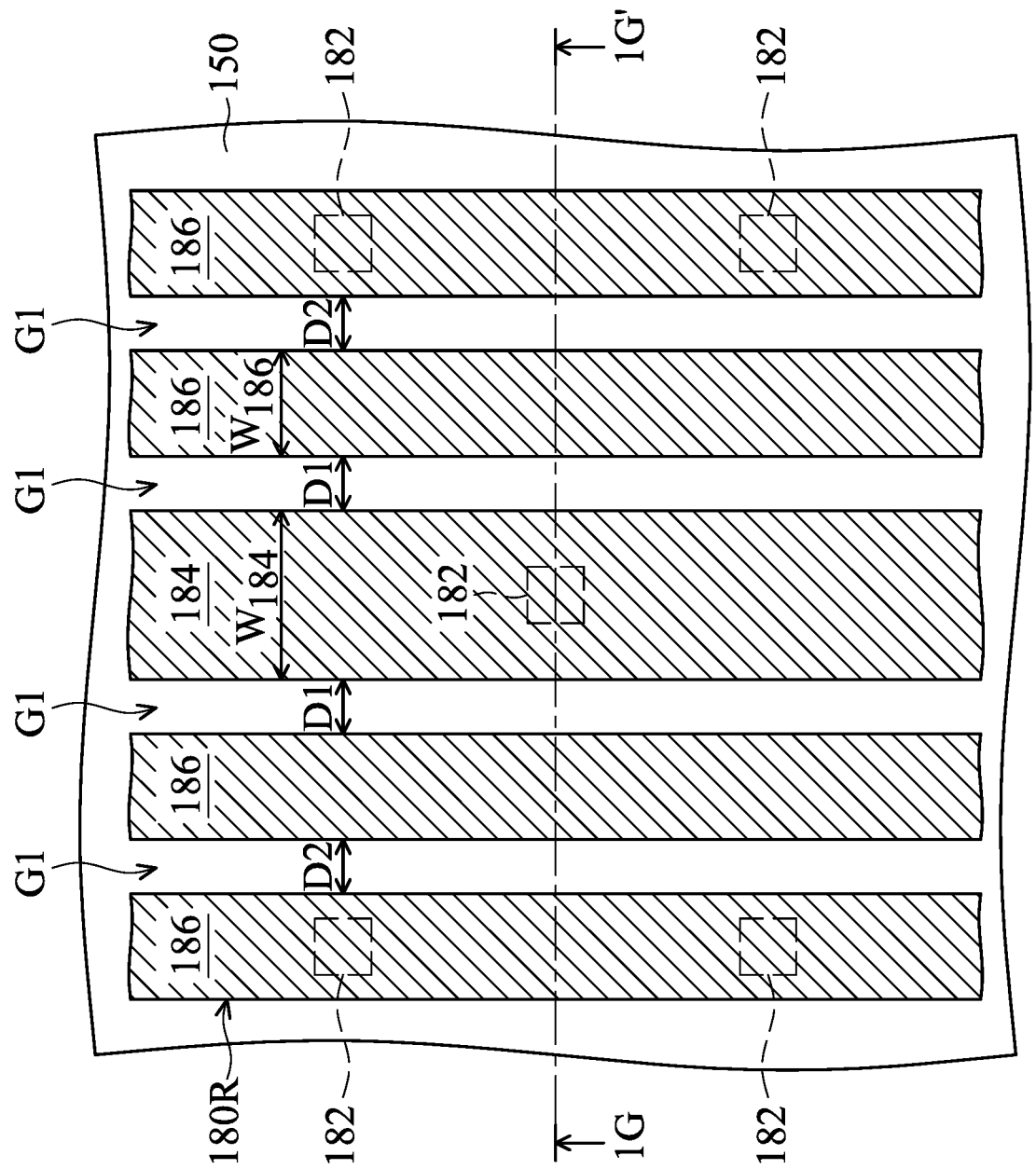

FIG. 1G-1 is a top view of the chip structure of FIG. 1G, in accordance with some embodiments. As shown in FIGS. 1G and 1G-1, the conductive layer 180 in the through hole TH1 and the seed layer 160 thereunder together form a conductive via structure 182, in accordance with some embodiments. The conductive via structure 182 pass through the passivation layers 130 and 150, in accordance with some embodiments. In some embodiments, the conductive via structure 182 have an inverted trapezoid shape.

As shown in FIGS. 1E, 1G, and 1G-1, the conductive layer 180, originally in the trench 172, and the seed layer 160 thereunder together form a conductive line 184, in accordance with some embodiments. The conductive line 184 has a linewidth $W_{184}$ ranging from about 10 μm to about 50 μm, in accordance with some embodiments. The conductive via structure 182 is directly connected between the conductive line 184 and the top metal wiring layer 124*b* thereunder, in accordance with some embodiments.

The conductive layer 180, originally in the trenches 174, and the seed layer 160 thereunder together form conductive lines 186, in accordance with some embodiments. The conductive line 186 has a linewidth $W_{186}$ ranging from about 2 µm to about 50 µm, in accordance with some embodiments.

In some embodiments, the linewidth $W_{184}$ is greater than the linewidth $W_{186}$, which increase the alignment tolerance between the conductive line 184 and a conductive pillar subsequently formed thereon. In some embodiments, a ratio of the linewidth $W_{184}$ to the linewidth $W_{186}$ ranges from about 1.5 to about 2.5. If the ratio is less than 1.5, the alignment tolerance between the conductive line 184 and the conductive pillar may be unable to be increased. If the ratio is greater than 2.5, the conductive line 184 may occupy too much layout space. In some other embodiments, the linewidth $W_{184}$ is substantially equal to the linewidth $W_{186}$, which reserves more space for wiring layout.

The conductive lines 184 and 186 together form a wiring layer 180R, in accordance with some embodiments. The wiring layer 180R is thicker than the wiring layers 124, in accordance with some embodiments. The wiring layer 180R has a thickness $T_{180R}$ ranging from about 2 µm to about 10 µm, in accordance with some embodiments. The conductive lines 184 and 186 are spaced apart from each other by gaps G1, in accordance with some embodiments.

The conductive line 184 has a top surface 184s1 and a lower surface 184s2, in accordance with some embodiments. Each conductive line 186 has a top surface 186s1 and a lower surface 186s2, in accordance with some embodiments. The top surface 184s1 is substantially level with (or coplanar with) the top surfaces 186s1 of the conductive lines 186, in accordance with some embodiments. The lower surface 184s2 is substantially level with (or coplanar with) the lower surfaces 186s2 of the conductive lines 186, in accordance with some embodiments.

As shown in FIG. 1G-1, the conductive lines 184 and 186 are substantially parallel to each other, in accordance with some embodiments. In some embodiments, a distance D1 between the conductive lines 184 and 186 is substantially equal to a distance D2 between the conductive lines 186, which improves the arrangement uniformity of the wiring layer 180R and therefore improves the planarity of a top surface of an insulating layer that is subsequently formed thereover. Therefore, the planarity of a top surface of a conductive pillar subsequently formed over the insulating layer is improved as well, in accordance with some embodiments. The distance D1 ranges from about 4 µm to about 30 µm, in accordance with some embodiments. The distance D2 ranges from about 4 µm to about 30 µm, in accordance with some embodiments.

In some embodiments, a ratio of an area of a top surface of the wiring layer 180R to the area of the top surface 121 of the interconnect structure 120 ranges from about 55% to about 70%. The ratio is also referred to as a density of the wiring layer 180R, in accordance with some embodiments.

If the ratio (i.e. the density of the wiring layer 180R) is less than 55%, the arrangement uniformity of the wiring layer 180R is not enough, which is not conducive to the planarity of a top surface of an insulating layer that is subsequently formed thereover. If the ratio (i.e. the density of the wiring layer 180R) is greater than 70%, the thermal stress between the wiring layer 180R and the insulating layer subsequently formed thereover may be large.

Figure 1H:
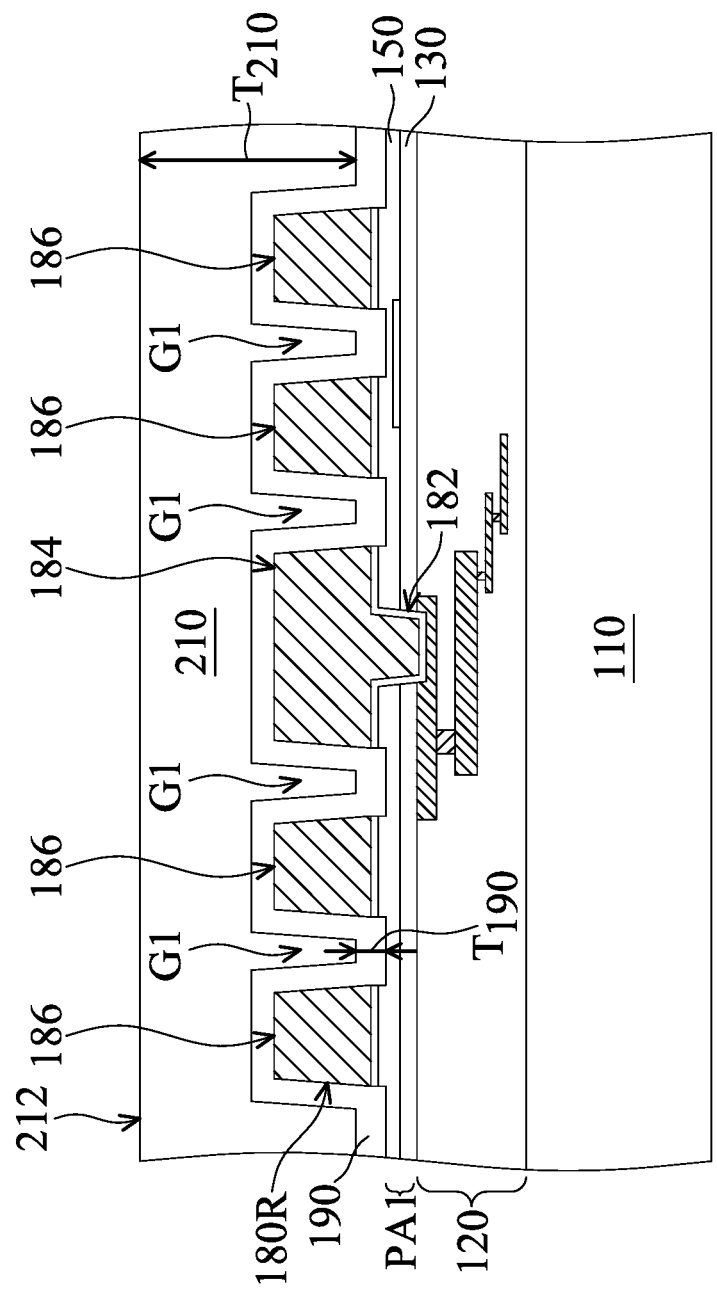

As shown in FIG. 1H, a passivation layer 190 is conformally formed over the passivation layer 150 and the wiring layer 180R, in accordance with some embodiments. The passivation layer 190 conformally covers the conductive lines 184 and 186 and the gaps G1 therebetween, in accordance with some embodiments. The passivation layer 190 is thicker than the first passivation layer PA1, in accordance with some embodiments. The passivation layer 190 has a thickness $T_{190}$ ranging from about 0.8 µm to about 1.7 µm, in accordance with some embodiments.

The passivation layer 190 is made of a dielectric material, such as nitrides (e.g., silicon nitride or silicon oxynitride), in accordance with some embodiments. The passivation layer 190 is formed using a deposition process (e.g., a chemical vapor deposition process or a physical vapor deposition process), in accordance with some embodiments.

As shown in FIG. 1H, an insulating layer 210 is formed over the passivation layer 190, in accordance with some embodiments. The gaps G1 are filled with the insulating layer 210, in accordance with some embodiments. The insulating layer 210 has a substantially flat top surface 212, in accordance with some embodiments. Since the arrangement uniformity of the wiring layer 180R is improved, the planarity of the top surface 212 is improved as well, in accordance with some embodiments.

The top surface 212 continuously extends across the conductive lines 184 and 186 and the gaps G1 therebetween, in accordance with some embodiments. The insulating layer 210 has a thickness $T_{210}$ ranging from about 5 µm to about 15 µm, in accordance with some embodiments. The insulating layer 210 is made of a polymer material such as polyimide (PI), in accordance with some embodiments.

Figure 1I:
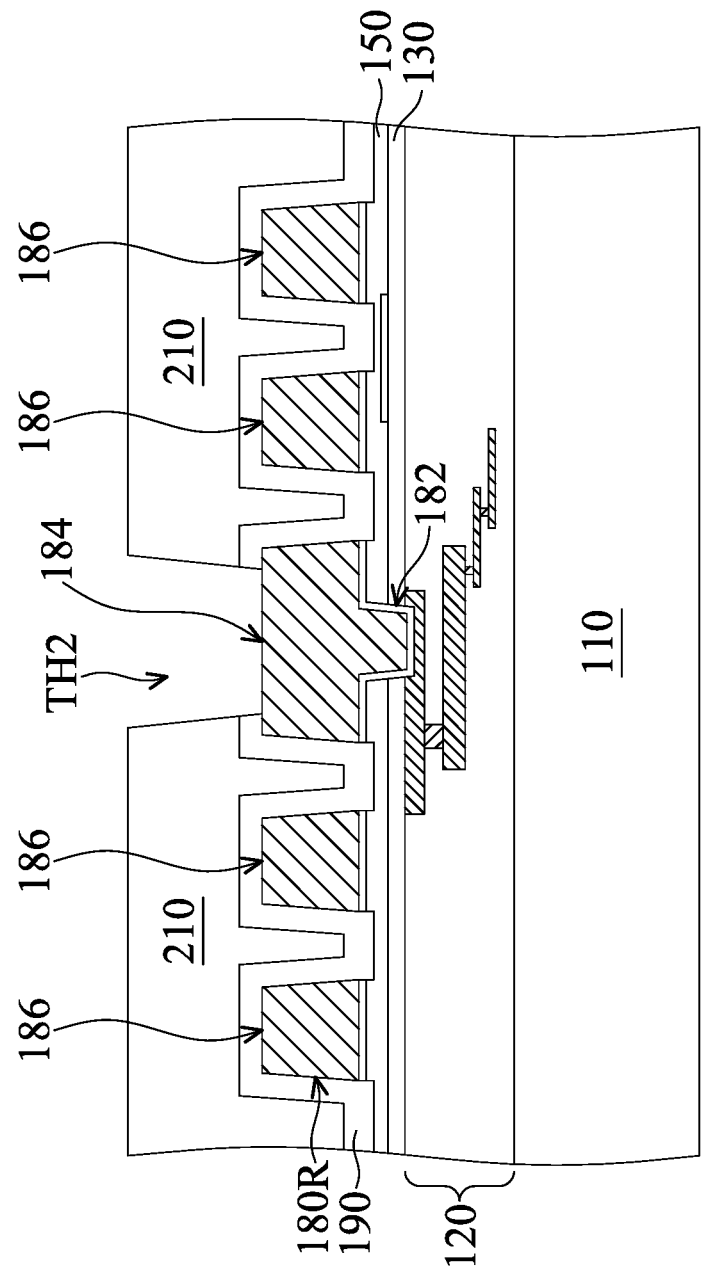

As shown in FIG. 1I, portions of the insulating layer 210 and the passivation layer 190 over the conductive line 184 are removed to form a through hole TH2 in the insulating layer 210 and the passivation layer 190, in accordance with some embodiments. The through hole TH2 exposes a portion of the conductive line 184, in accordance with some embodiments. The removal process includes an etching process such as a dry etching process, in accordance with some embodiments.

Thereafter, a seed layer (not shown) is conformally formed over the passivation layer 190, the insulating layer 210, and the conductive line 184, in accordance with some embodiments. The seed layer is in direct contact with the passivation layer 190, the insulating layer 210, and the conductive line 184, in accordance with some embodiments.

The seed layer is made of a conductive material, such as metal (e.g., copper, aluminum, gold, silver, or tungsten) or alloys thereof, in accordance with some embodiments. The seed layer is formed using a deposition process, such as a physical vapor deposition process, in accordance with some embodiments.

Figure 1J:
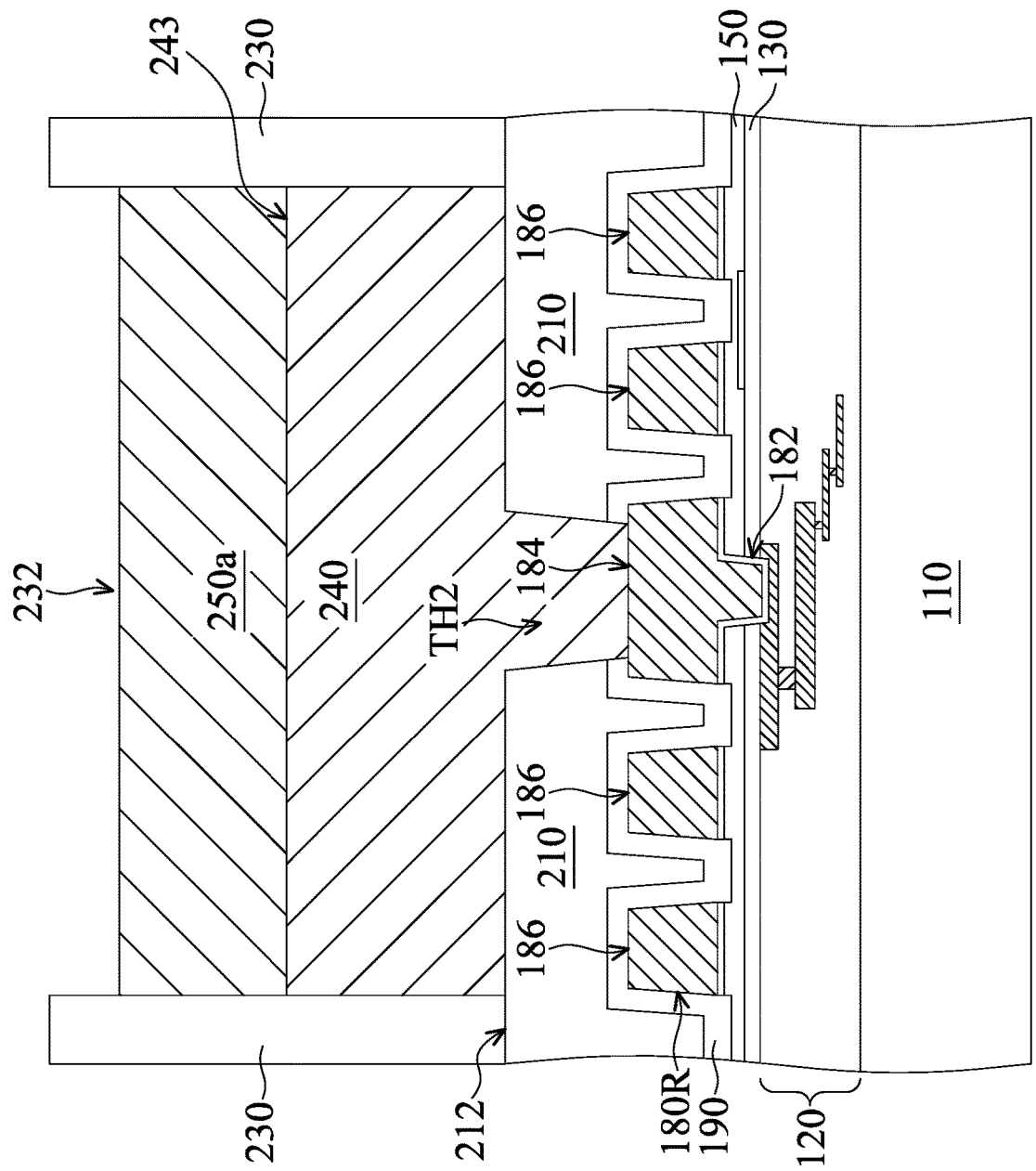

As shown in FIG. 1J, a mask layer 230 is formed over the seed layer (not shown), in accordance with some embodiments. The mask layer 230 has an opening 232 exposing a portion of the seed layer, in accordance with some embodiments. The mask layer 230 is made of a polymer material, such as a photoresist material, in accordance with some embodiments.

As shown in FIG. 1J, a conductive pillar 240 is formed over the seed layer exposed by the opening 232, in accordance with some embodiments. Since the seed layer is very thin, the seed layer may be seen as a portion of the conductive pillar 240, in accordance with some embodiments. The conductive pillar 240 has a top surface 243, in accordance with some embodiments. Since the conductive pillar 240 is formed over the substantially flat top surface 212 of the insulating layer 210, the top surface 243 is a substantially flat top surface, in accordance with some embodiments.

The conductive pillar 240 is made of a conductive material, such as metal (e.g., titanium, copper, nickel, or aluminum) or alloys thereof, in accordance with some embodiments. The conductive pillar 240 is formed using a plating process, such as an electroplating process, in accordance with some embodiments.

As shown in FIG. 1J, a solder layer 250a is formed over the conductive pillar 240, in accordance with some embodiments. The solder layer 250a is made of a conductive material, such as metal (e.g., tin or the like) or alloys thereof, in accordance with some embodiments. The solder layer 250a is formed using a plating process, such as an electroplating process, in accordance with some embodiments.

Figure 1K:
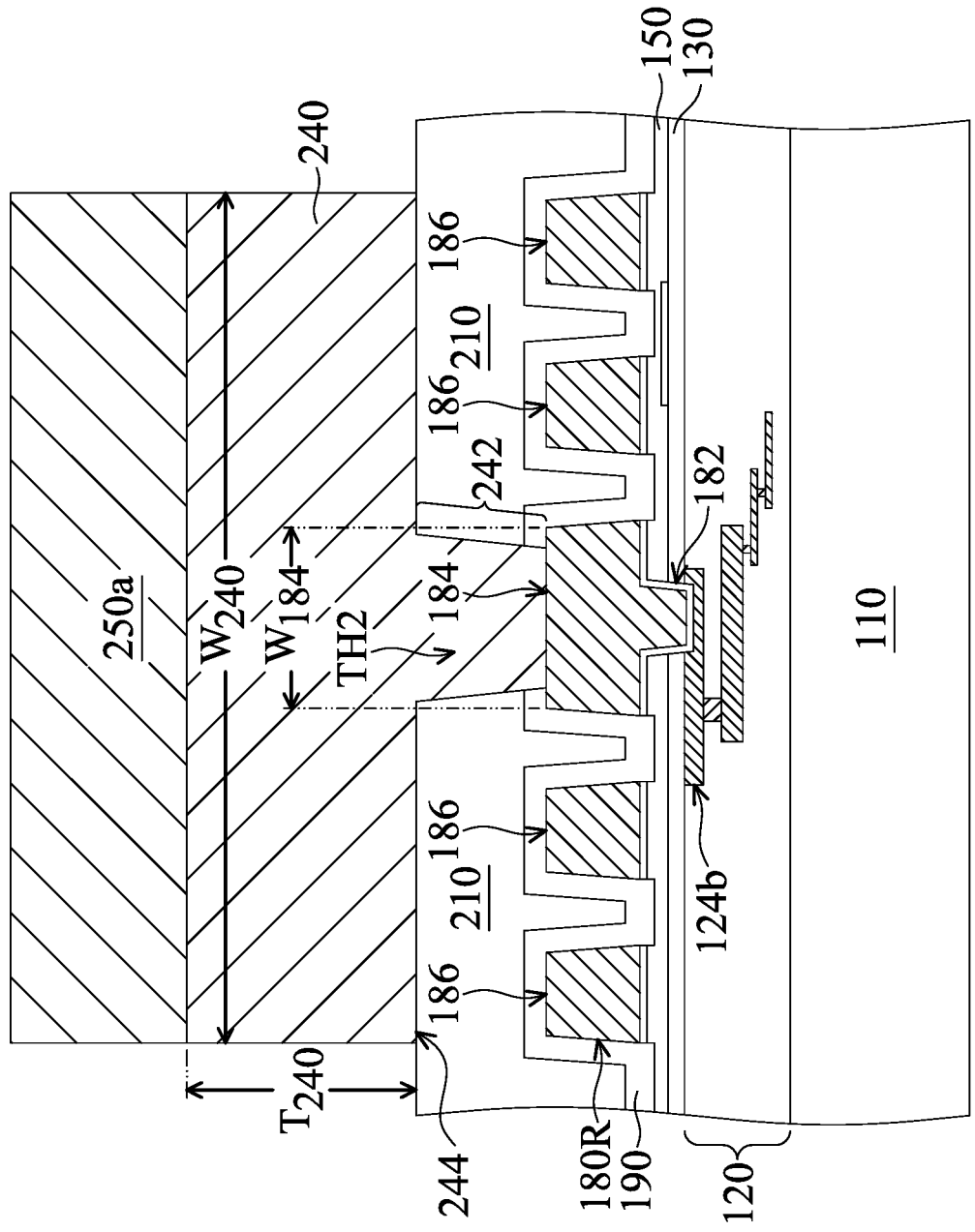

As shown in FIG. 1K, the mask layer 230 is removed, in accordance with some embodiments. The seed layer originally under the mask layer 230 is removed as well, in accordance with some embodiments. The removal process includes an etching process such as a wet etching process, in accordance with some embodiments.

The conductive pillar 240 is formed over the insulating layer 210 and in the through hole TH2, in accordance with some embodiments. The conductive pillar 240 is over the conductive lines 184 and 186, in accordance with some embodiments. The conductive pillar 240 is formed in one piece, in accordance with some embodiments.

The conductive pillar 240 has a bottom protruding portion 242 and a lower surface 244, in accordance with some embodiments. The bottom protruding portion 242 protrudes from the lower surface 244, in accordance with some embodiments. The bottom protruding portion 242 is in the through hole TH2, in accordance with some embodiments.

The bottom protruding portion 242 passes through the insulating layer 210 and the passivation layer 190, in accordance with some embodiments. The bottom protruding portion 242 is in direct contact with the conductive line 184, in accordance with some embodiments. The conductive via structure 182 is under the bottom protruding portion 242, which shortens the conductive path between the conductive pillar 240 and the wiring layer 124b, in accordance with some embodiments.

In some embodiments, the linewidth $W_{184}$ of the conductive line 184 under the conductive pillar 240 is less than a width $W_{240}$ of the conductive pillar 240. The width $W_{240}$ ranges from about 60 µm to about 105 µm, in accordance with some embodiments. The conductive pillar 240 has a thickness $T_{240}$ ranges from about 30 µm to about 50 µm, in accordance with some embodiments.

Figure 1L:
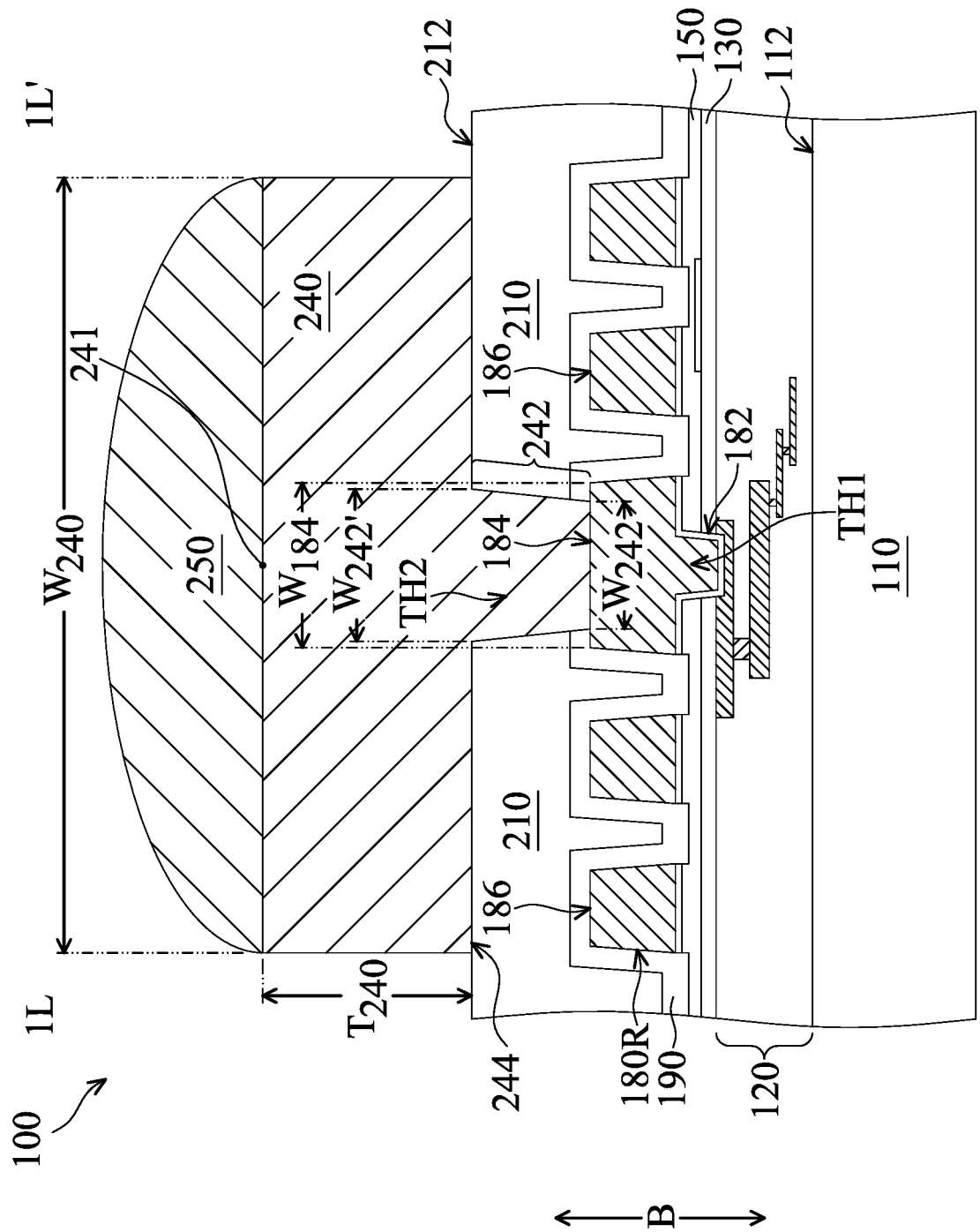
Figures 1, 1L:
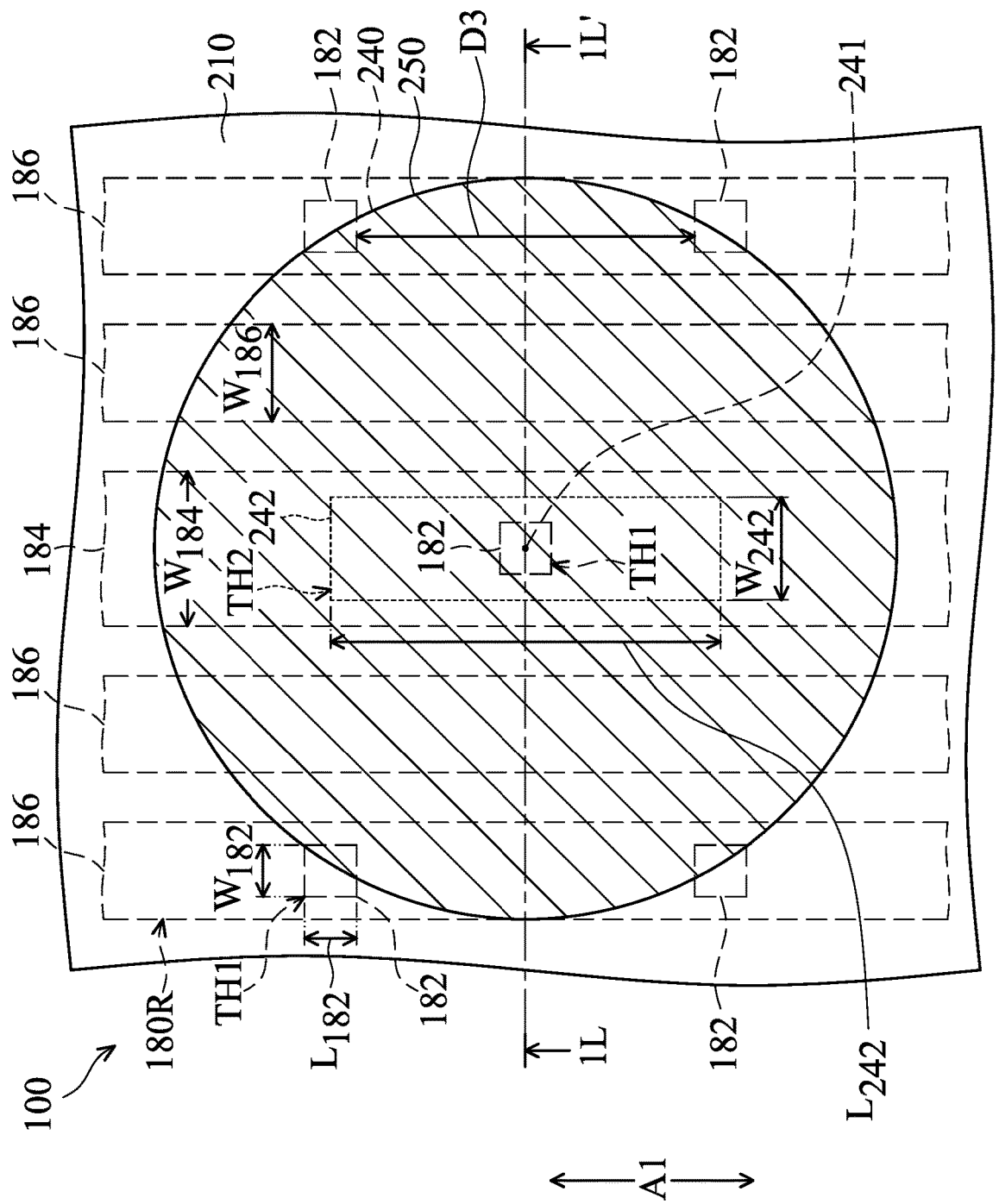

FIG. 1L-1 is a top view of the chip structure of FIG. 1L, in accordance with some embodiments. As shown in FIGS. 1K, 1L and 1L-1, a reflow process is performed over the solder layer 250a to form a solder bump 250, in accordance with some embodiments. The solder bump 250 is in direct contact with the conductive pillar 240, in accordance with some embodiments. In this step, a chip structure 100 is substantially formed, in accordance with some embodiments.

As shown in FIG. 1L-1, the through hole TH2 and the bottom protruding portion 242 have a strip shape, such as a rectangle shape, in accordance with some embodiments. In some embodiments, a longitudinal axis A1 of the through hole TH2 or the bottom protruding portion 242 is substantially parallel to a portion of the conductive line 184 under the conductive pillar 240.

As shown in FIG. 1L-1, a width $W_{242}$ of the bottom protruding portion 242 or the through hole TH2 ranges from about 5 µm to about 15 µm, in accordance with some embodiments. As shown in FIG. 1L-1, a length $L_{242}$ of the bottom protruding portion 242 or the through hole TH2 ranges from about 20 µm to about 40 µm, in accordance with some embodiments.

As shown in FIG. 1L-1, a width $W_{182}$ of the conductive via structure 182 or the through hole TH1 ranges from about 1 µm to about 6 µm, in accordance with some embodiments. As shown in FIG. 1L-1, a length $L_{182}$ of the conductive via structure 182 or the through hole TH1 ranges from about 1 µm to about 6 µm, in accordance with some embodiments. As shown in FIG. 1L-1, a distance D3 between the conductive via structures 182 is substantially equal to or greater than 2 µm, in accordance with some embodiments.

As shown in FIG. 1L, the conductive via structure 182, the bottom protruding portion 242, and a center portion 241 of the conductive pillar 240 are aligned with each other in a direction B perpendicular to the top surface 112 of the substrate 110, in accordance with some embodiments.

The material property of copper may reduce the stress migration and the electromigration effect, in accordance with some embodiments. Therefore, if the conductive line 184 and the conductive via structure 182 are made of copper, the stress migration and the electromigration effect are reduced, in accordance with some embodiments.

The (thick) insulating layer 210 is able to absorb a portion of the bonding stress in a subsequent bonding process, which reduces the bonding stress transmitted to the wiring layers 180R and 124 therebelow, in accordance with some embodiments. Therefore, there is no need to form conductive pads in the wiring layer 180R under the conductive pillar 240, in accordance with some embodiments. Therefore, the conductive pad is replaced by the conductive line 184, which is narrower than the conductive pad, in accordance with some embodiments. As a result, the (narrower) conductive line 184 may reserve more space under the conductive pillar 240 for wiring layout than the conductive pads, in accordance with some embodiments.

Figure 2:
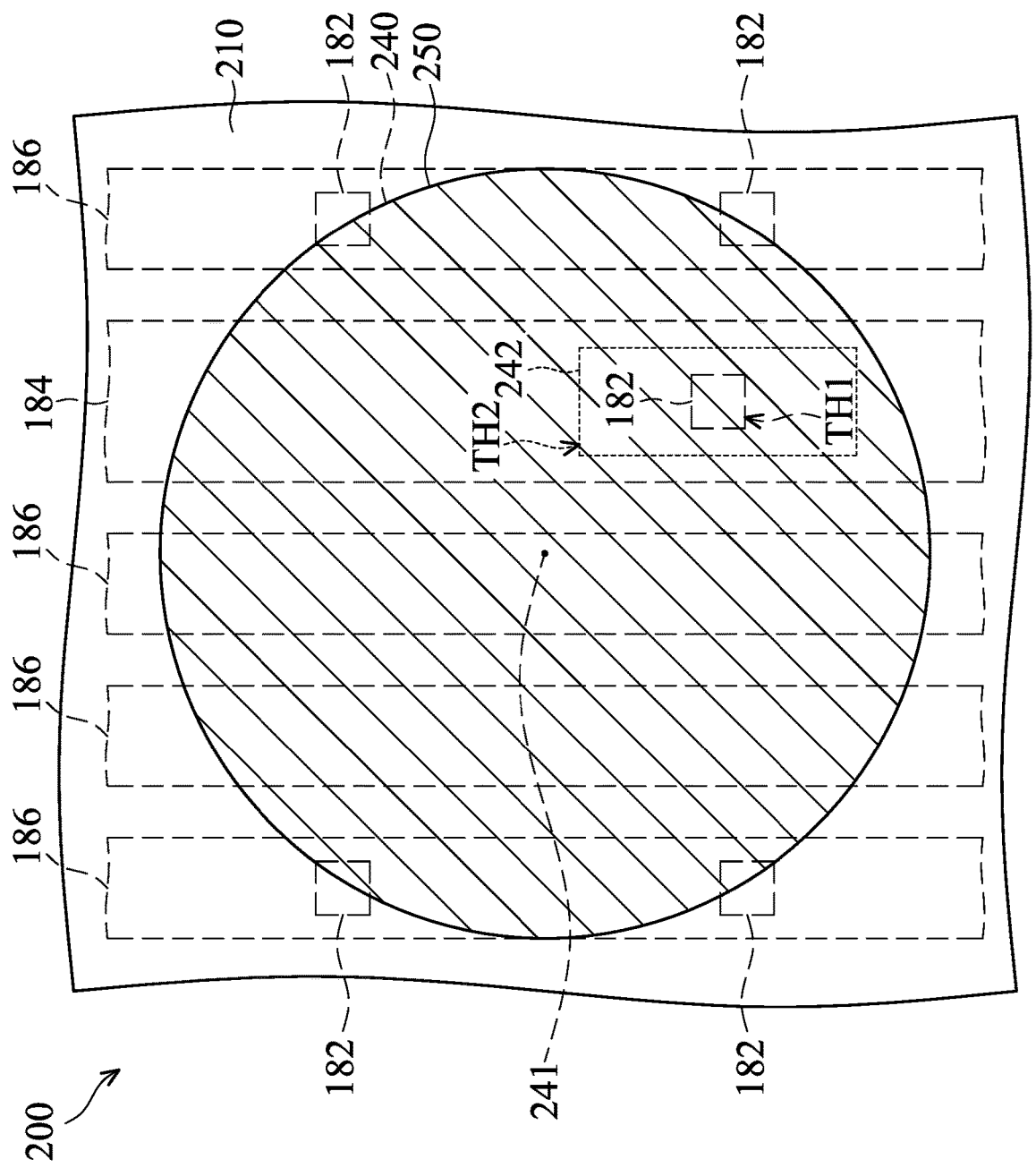
FIG. 2 is a top view of a chip structure, in accordance with some embodiments.

FIG. 2 is a top view of a chip structure 200, in accordance with some embodiments. As shown in FIG. 2, the chip structure 200 is similar to the chip structure 100 of FIGS. 1L and 1L-1, except that the conductive via structure 182, the conductive line 184, and the bottom protruding portion 242 of the conductive pillar 240 are not under the center portion 241 of the conductive pillar 240, in accordance with some embodiments. That is, the conductive via structure 182, the conductive line 184, and the bottom protruding portion 242 of the conductive pillar 240 are misaligned with the center portion 241 of the conductive pillar 240, in accordance with some embodiments.

Figure 3:
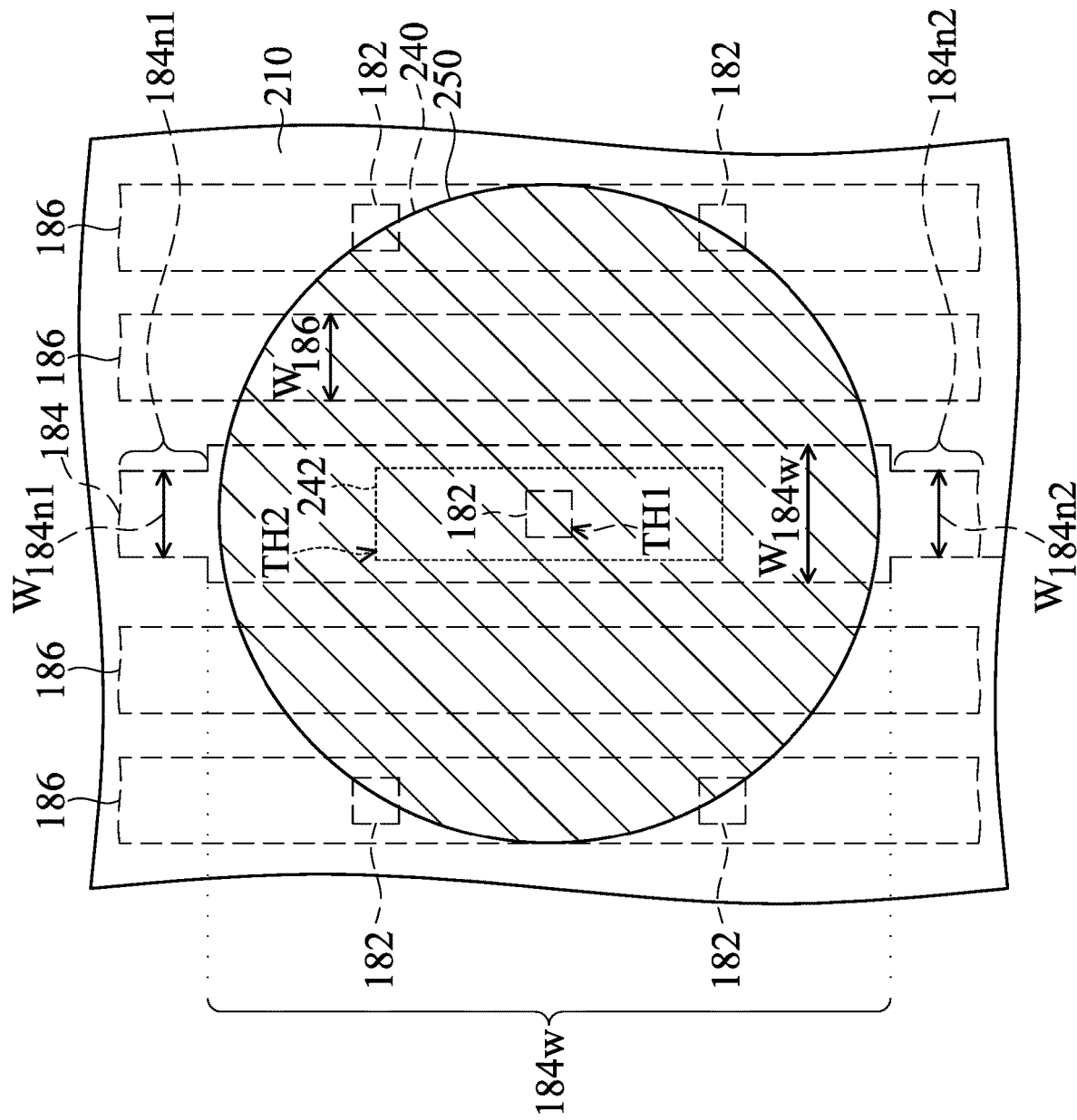
FIG. 3 is a top view of a chip structure, in accordance with some embodiments.

FIG. 3 is a top view of a chip structure 300, in accordance with some embodiments. As shown in FIG. 3, the chip structure 300 is similar to the chip structure 100 of FIGS. 1L and 1L-1, except that the conductive line 184, which is under the conductive pillar 240, is wider than the conductive line 184, which is not under the conductive pillar 240, in accordance with some embodiments.

That is, the conductive line 184 has a wide portion 184w and narrow portions 184n1 and 184n2, in accordance with some embodiments. The wide portion 184w is wider than both of the narrow portions 184n1 and 184n2, in accordance with some embodiments. The wide portion 184w is connected between the narrow portions 184n1 and 184n2, in accordance with some embodiments. The wide portion 184w is under the conductive pillar 240, in accordance with some embodiments. The narrow portions 184*n*1 and 184*n*2 are not under the conductive pillar 240, in accordance with some embodiments.

In some embodiments, a linewidth $W_{184w}$ of the wide portion 184*w* is greater than a linewidth $W_{184n1}$ of the narrow portion 184*n*1. In some embodiments, the linewidth $W_{184w}$ of the wide portion 184*w* is greater than a linewidth $W_{184n2}$ of the narrow portion 184*n*2. Therefore, the wide portion 184*w* may increase the alignment tolerance between the conductive line 184 and the bottom protruding portion 242 of the conductive pillar 240, and the narrow portions 184*n*1 and 184*n*2 may reserve more space, which is not under the conductive pillar 240, for wiring layout.

In some embodiments, a ratio of the linewidth $W_{184w}$ to the linewidth $W_{184n1}$ ranges from about 1.5 to about 2.5. In some embodiments, a ratio of the linewidth $W_{184w}$ to the linewidth $W_{184n2}$ ranges from about 1.5 to about 2.5.

In some embodiments, the linewidth $W_{184w}$ is greater than the linewidth $W_{186}$ of the conductive lines 186. In some embodiments, the linewidth $W_{184n1}$ or $W_{184n2}$ is substantially equal to the linewidth $W_{186}$ of the conductive lines 186.

Figure 4:
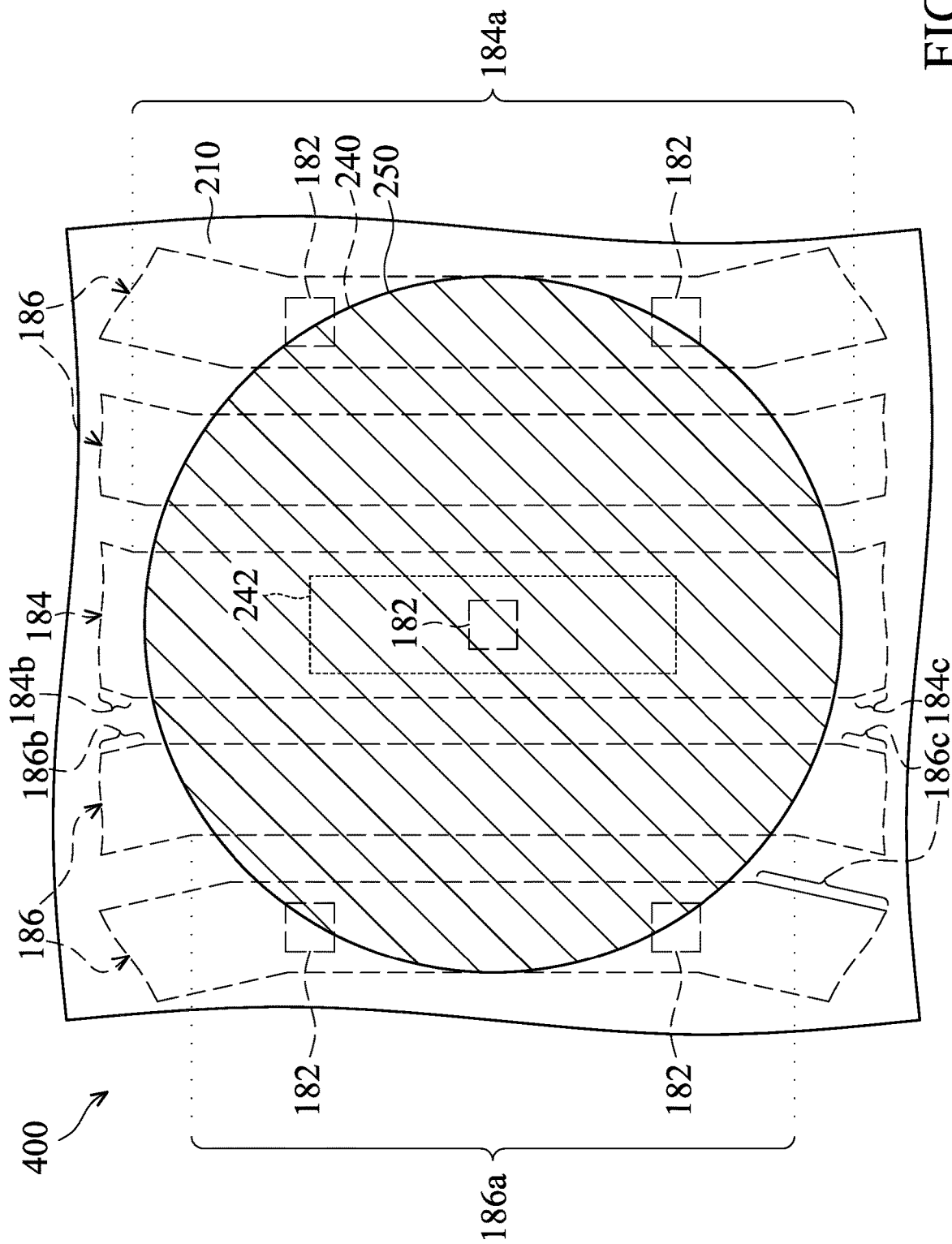
FIG. 4 is a top view of a chip structure, in accordance with some embodiments.

FIG. 4 is a top view of a chip structure 400, in accordance with some embodiments. As shown in FIG. 4, the chip structure 400 is similar to the chip structure 100 of FIGS. 1L and 1L-1, except that portions 184*b* and 184*c* of the conductive line 184, which are not under the conductive pillar 240, are not parallel to portions 186*b* and 186*c* of the conductive line 186, which are not under the conductive pillar 240, in accordance with some embodiments.

Specifically, the conductive line 184 includes portions 184*a*, 184*b* and 184*c*, in accordance with some embodiments. The portion 184*a* is connected between the portions 184*b* and 184*c* and is under the conductive pillar 240, in accordance with some embodiments. The portions 184*b* and 184*c* are not under the conductive pillar 240, in accordance with some embodiments. The portions 184*b* and 184*c* are not parallel to the portion 184*a*, in accordance with some embodiments.

The conductive line 186 includes portions 186*a*, 186*b* and 186*c*, in accordance with some embodiments. The portion 186*a* is connected between the portions 186*b* and 186*c* and is under the conductive pillar 240, in accordance with some embodiments. The portions 186*b* and 186*c* are not under the conductive pillar 240, in accordance with some embodiments. The portions 186*b* and 186*c* are not parallel to the portion 186*a*, in accordance with some embodiments.

The portion 184*a* of the conductive line 184 is parallel to the portion 186*a* of the conductive line 186, in accordance with some embodiments. The portions 184*b* and 184*c* are not parallel to the portions 186*b* and 186*c*, in accordance with some embodiments. That is, the conductive lines 184 and 186 under the conductive pillar 240 are parallel to each other to form the insulating layer 210 with the substantially flat top surface so as to form the conductive pillar 240 with the substantially flat top surface. The design of the conductive lines 184 and 186, which are not under the conductive pillar 240, does not affect the planarity of the top surface of the conductive pillar 240 and therefore has more freedom of wiring layout.

Figure 5:
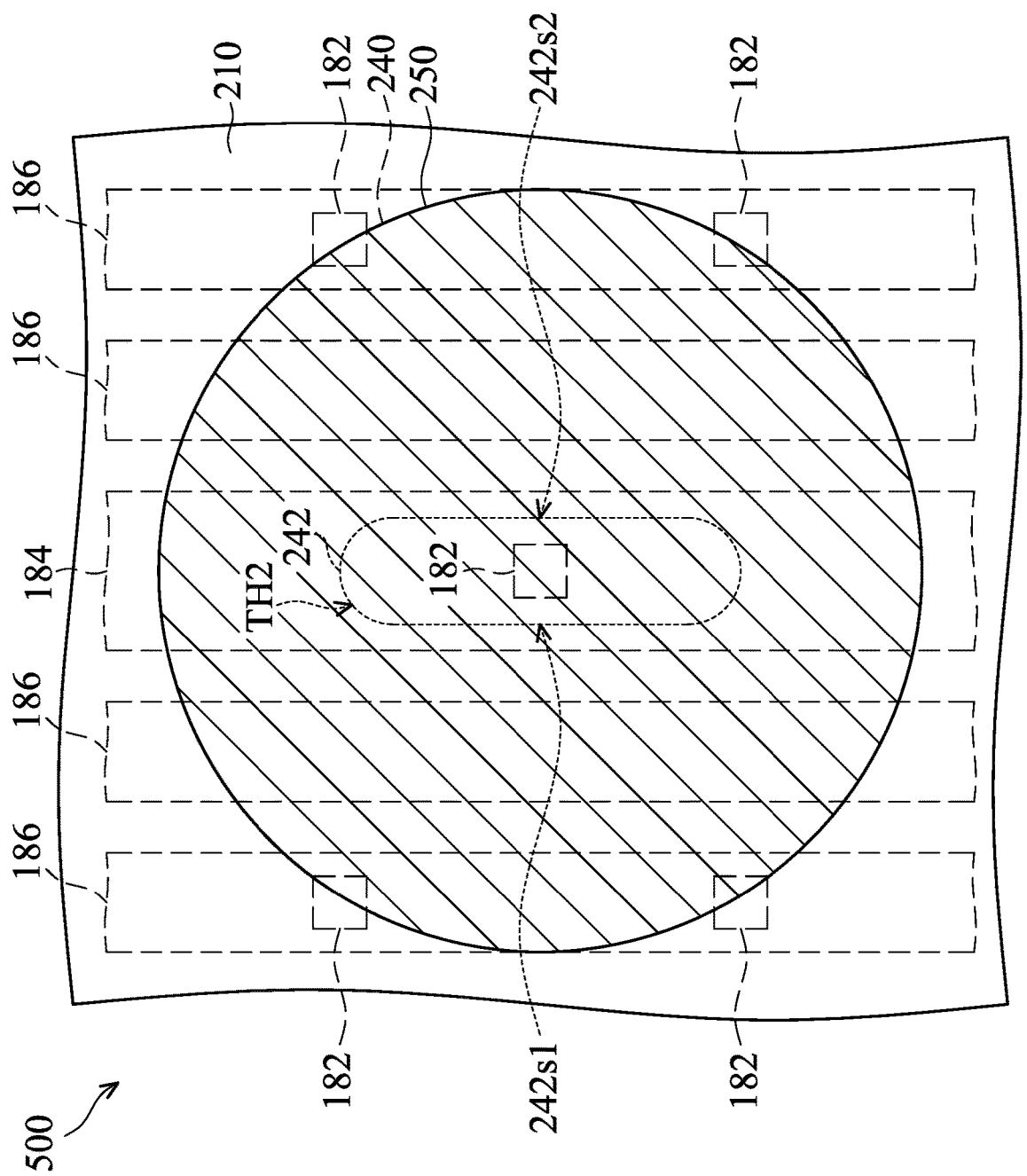
FIG. 5 is a top view of a chip structure, in accordance with some embodiments.

FIG. 5 is a top view of a chip structure 500, in accordance with some embodiments. As shown in FIG. 5, the chip structure 500 is similar to the chip structure 100 of FIGS. 1L and 1L-1, except that the bottom protruding portion 242 of the conductive pillar 240 of the chip structure 500 has a substantially oval-like shape, in accordance with some embodiments. In some embodiments, opposite sidewalls 242*s*1 and 242*s*2 of the bottom protruding portion 242 are substantially parallel to each other.

Figure 6:
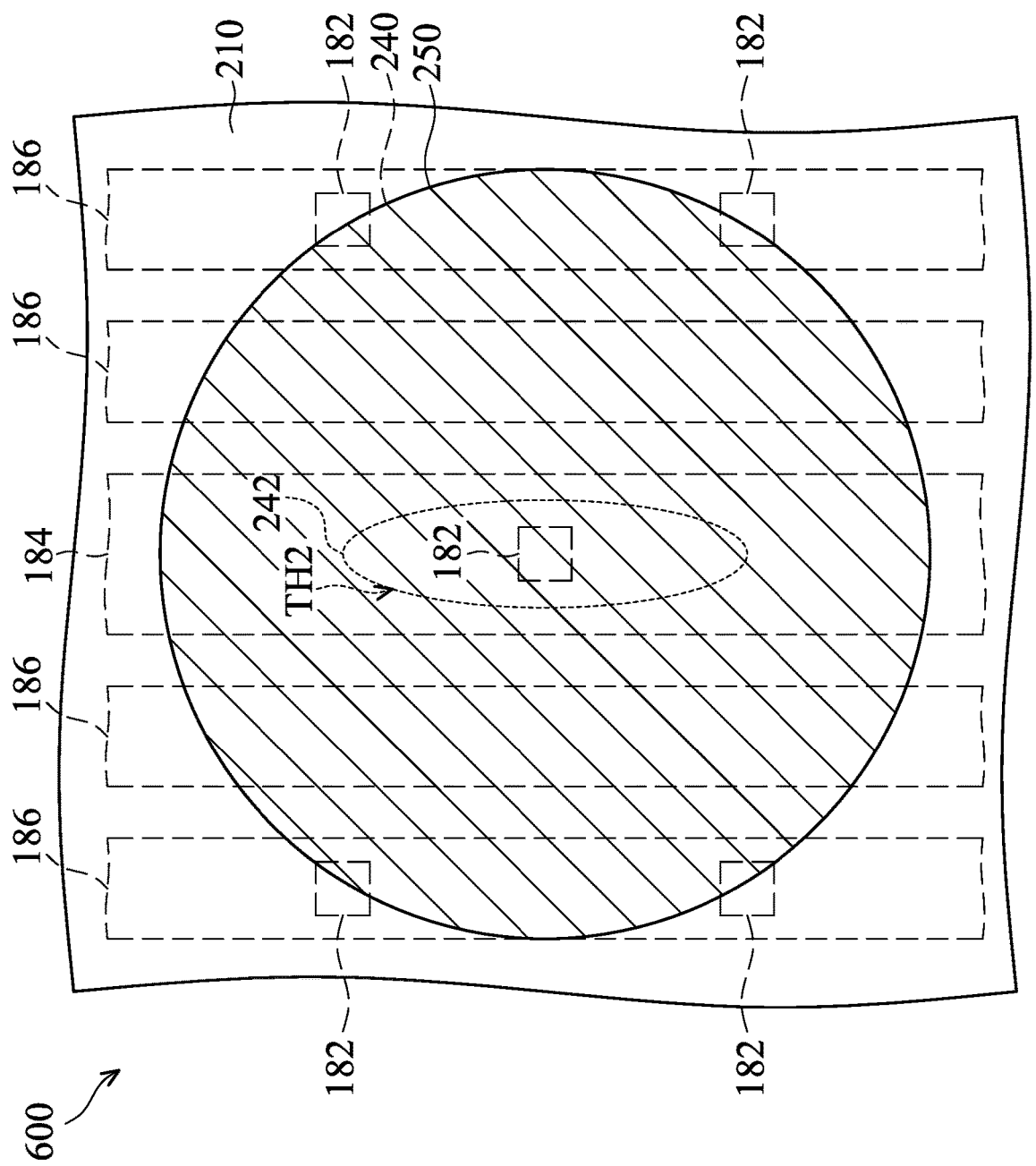
FIG. 6 is a top view of a chip structure, in accordance with some embodiments.

FIG. 6 is a top view of a chip structure 600, in accordance with some embodiments. As shown in FIG. 6, the chip structure 600 is similar to the chip structure 100 of FIGS. 1L and 1L-1, except that the bottom protruding portion 242 of the conductive pillar 240 of the chip structure 600 has an oval shape, in accordance with some embodiments.

Figure 7A:
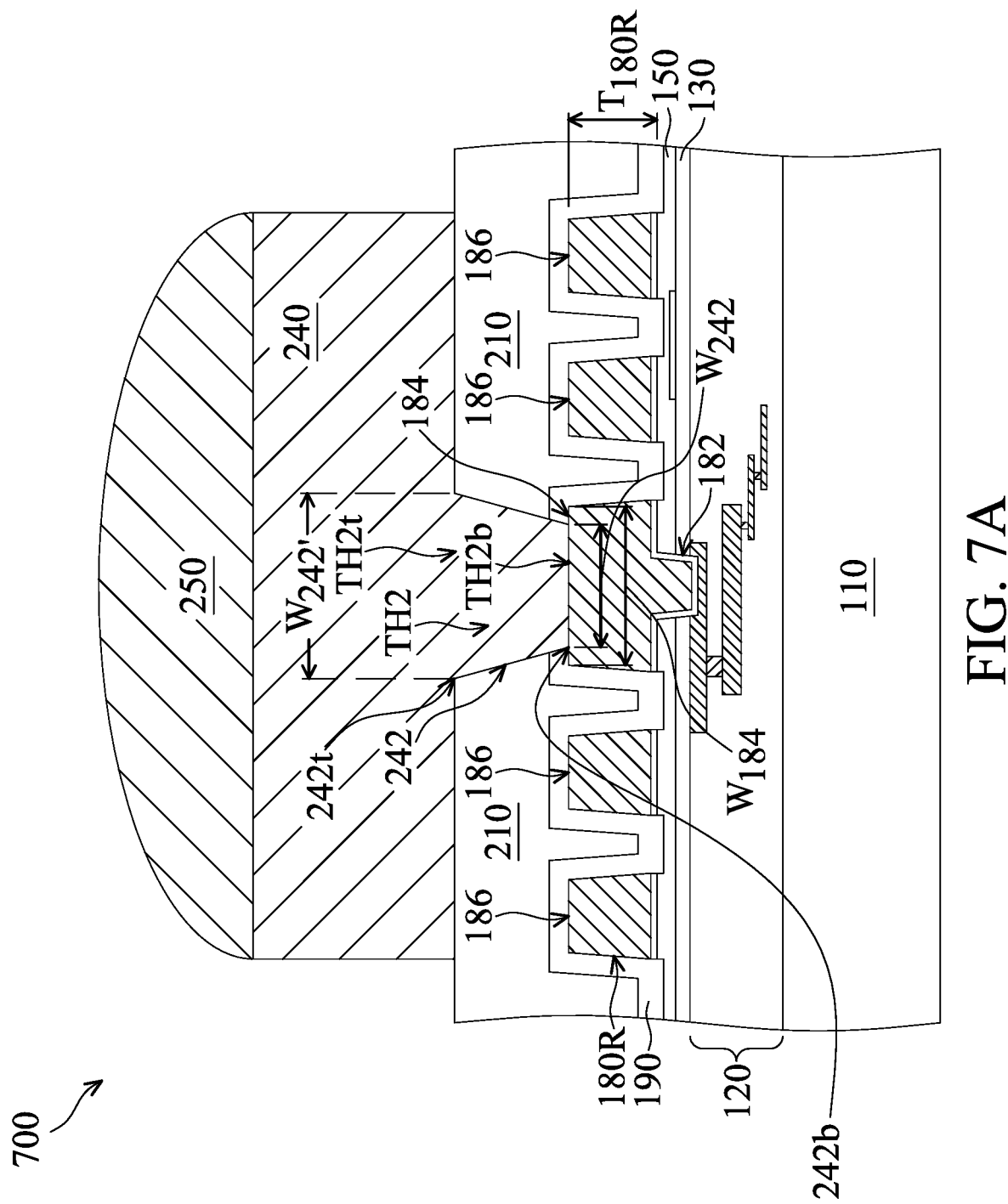
FIG. 7A is a cross-sectional view of a chip structure, in accordance with some embodiments.
Figure 7B:
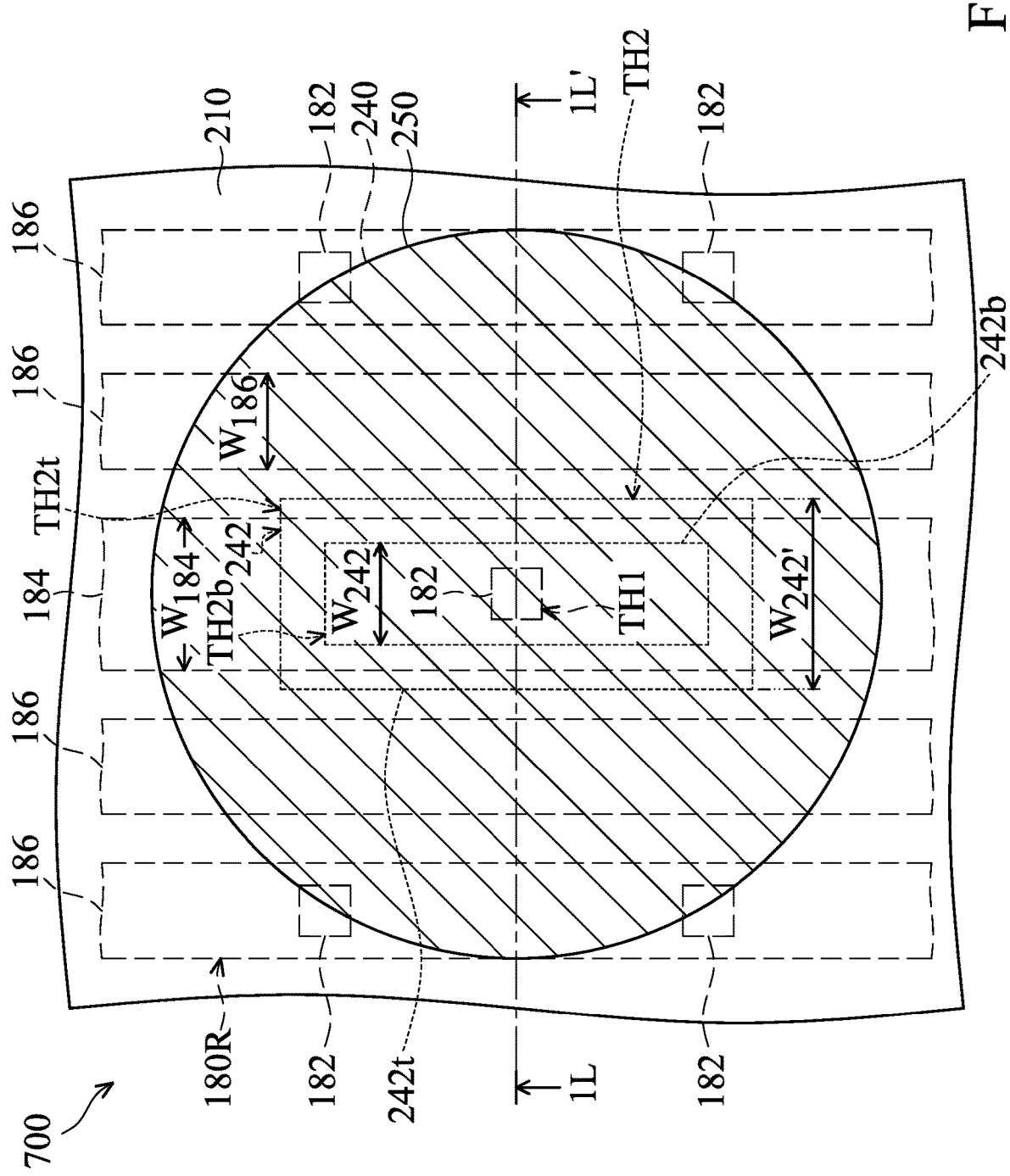
FIG. 7B is a top view of the chip structure of FIG. 7A, in accordance with some embodiments.

FIG. 7A is a cross-sectional view of a chip structure 700, in accordance with some embodiments. FIG. 7B is a top view of the chip structure 700 of FIG. 7A, in accordance with some embodiments. As shown in FIGS. 7A and 7B, the chip structure 700 is similar to the chip structure 100 of FIGS. 1L and 1L-1, except that a width $W_{242t}$ of a top 242*t* of the bottom protruding portion 242 of the conductive pillar 240 (or a top TH2*t* of the through hole TH2) is greater than the linewidth $W_{184}$ of the conductive line 184, in accordance with some embodiments.

The width $W_{242}$ of a bottom 242*b* of the bottom protruding portion 242 of the conductive pillar 240 (or a bottom TH2*b* of the through hole TH2) is less than the linewidth $W_{184}$ of the conductive line 184, in accordance with some embodiments.

Figure 8:
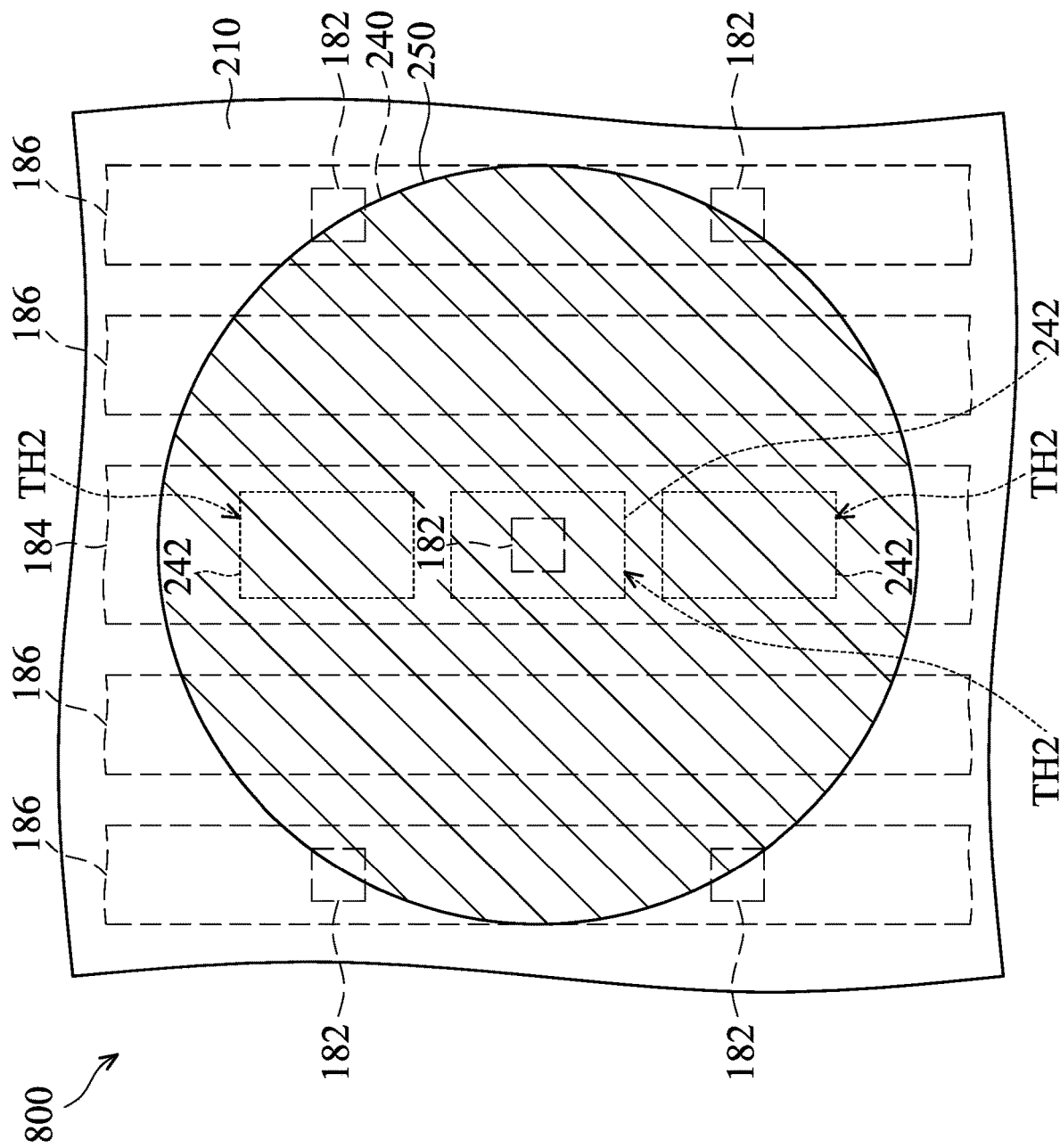
FIG. 8 is a top view of a chip structure, in accordance with some embodiments.

FIG. 8 is a top view of a chip structure 800, in accordance with some embodiments. As shown in FIG. 8, the chip structure 800 is similar to the chip structure 100 of FIGS. 1L and 1L-1, except that the conductive pillar 240 has more than one bottom protruding portion 242, in accordance with some embodiments. The conductive pillar 240 has, for example, three bottom protruding portions 242, in accordance with some embodiments. The bottom protruding portions 242 are arranged along a portion of the conductive line 184 under the conductive pillar 240, in accordance with some embodiments.

The bottom protruding portions 242 are able to share the bonding stress during a subsequent bonding process for bonding the conductive pillar 240 to a substrate (not shown) through the solder bump 250, in accordance with some embodiments. Therefore, the bottom protruding portions 242 are able to prevent the bonding stress from concentrating in only one bottom protruding portion 242, which improves the reliability of the chip structure 800, in accordance with some embodiments.

If one of the bottom protruding portions 242 is broken, the others of the bottom protruding portions 242 may still connected to the conductive line 184. Therefore, the multiple bottom protruding portions 242 may improve the reliability of the electrical connection between the conductive line 184 and the conductive pillar 240.

Figure 9:
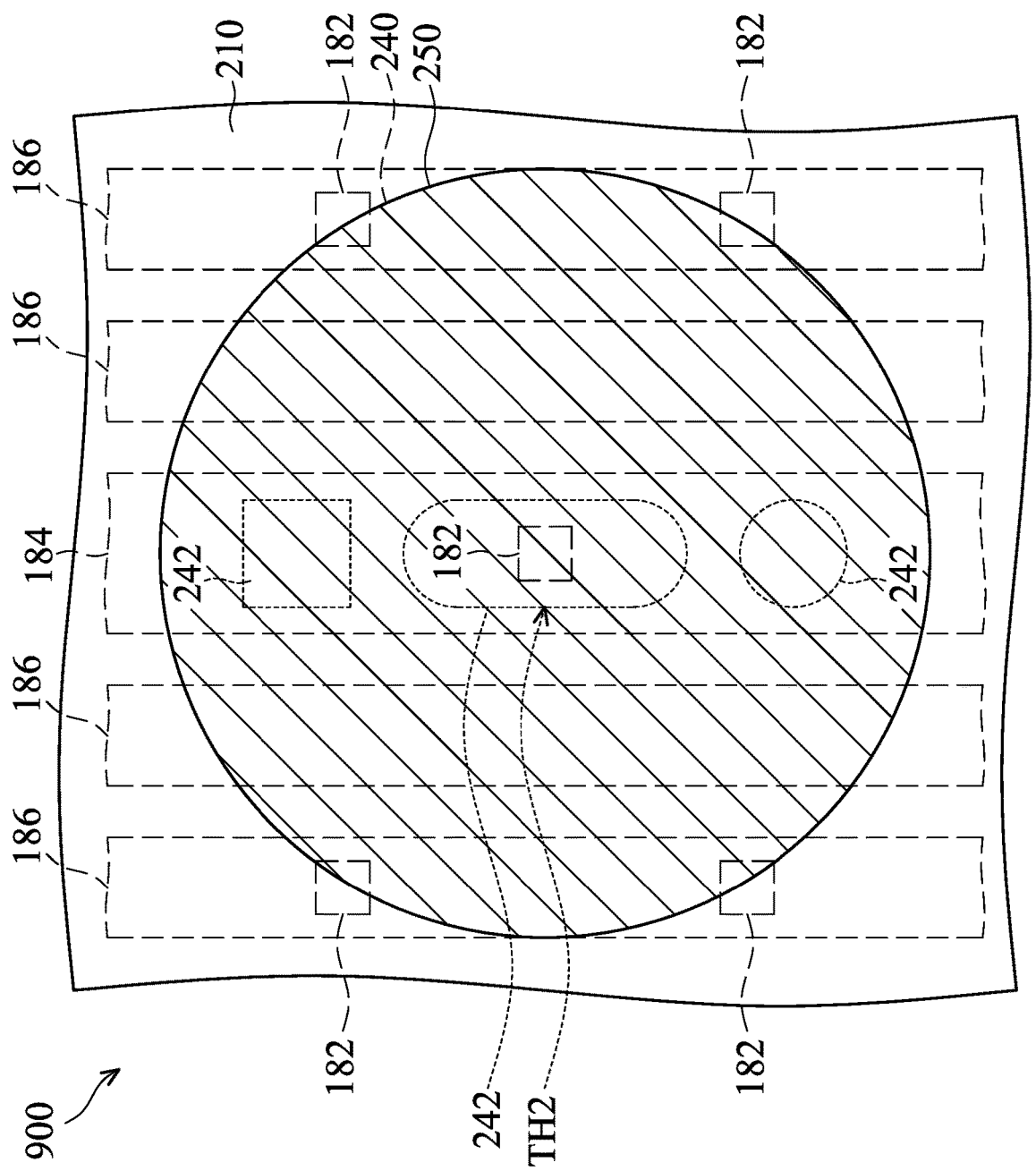
FIG. 9 is a top view of a chip structure, in accordance with some embodiments.

FIG. 9 is a top view of a chip structure 900, in accordance with some embodiments. As shown in FIG. 9, the chip structure 900 is similar to the chip structure 800 of FIG. 8, except that the bottom protruding portions 242 of the conductive pillar 240 of the chip structure 900 have different shapes, in accordance with some embodiments. In some embodiments, the bottom protruding portions 242 have a square-like shape, a substantially oval-like shape, and a round-like shape, respectively, in accordance with some embodiments.

Figure 10:
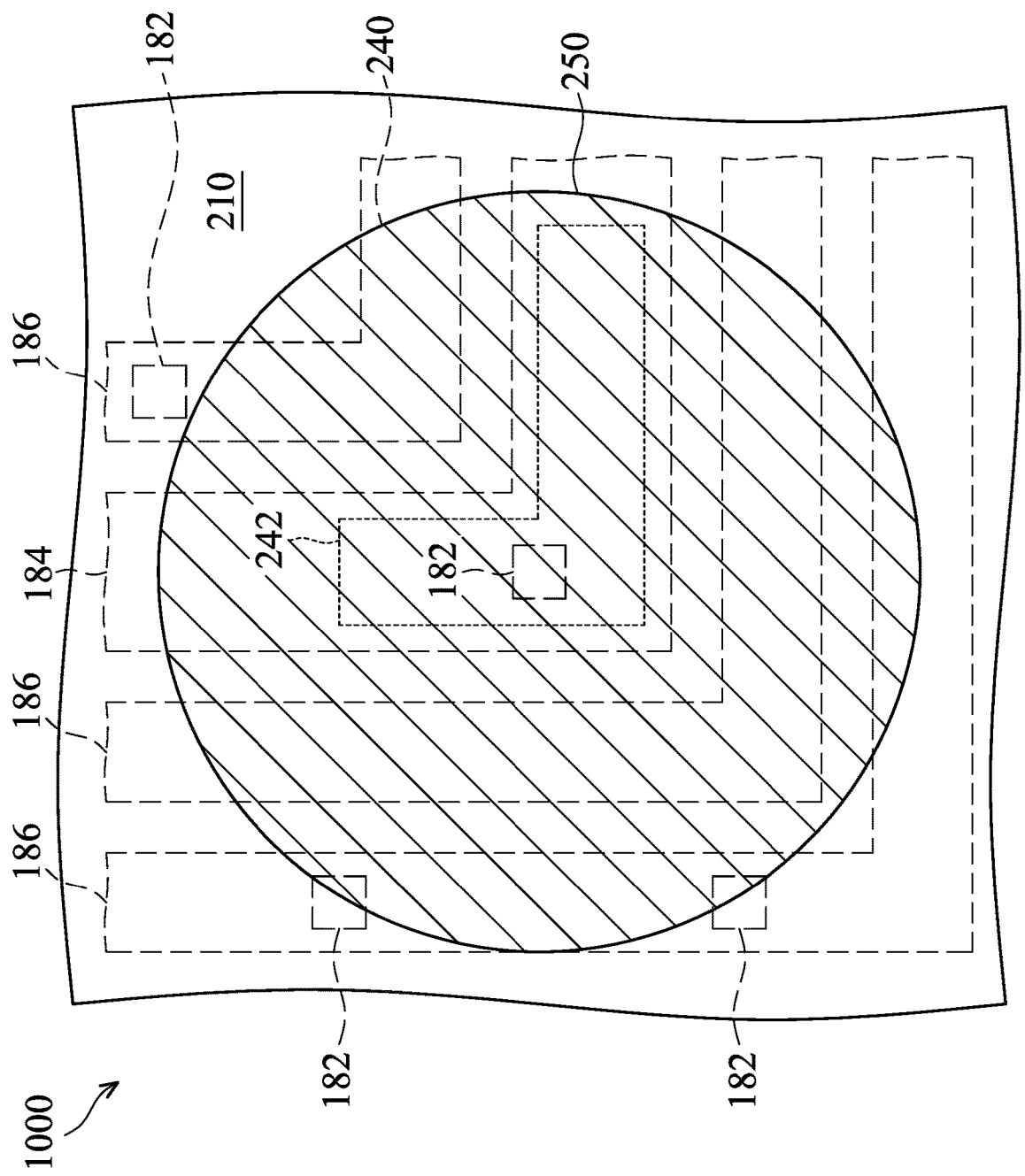
FIG. 10 is a top view of a chip structure, in accordance with some embodiments.

FIG. 10 is a top view of a chip structure 1000, in accordance with some embodiments. As shown in FIG. 10, the chip structure 1000 is similar to the chip structure 100 of FIGS. 1L and 1L-1, except that the conductive lines 184 and 186 under the conductive pillar 240 and the bottom protruding portion 242 of the conductive pillar 240 have an L-like shape, in accordance with some embodiments.

Figure 11:
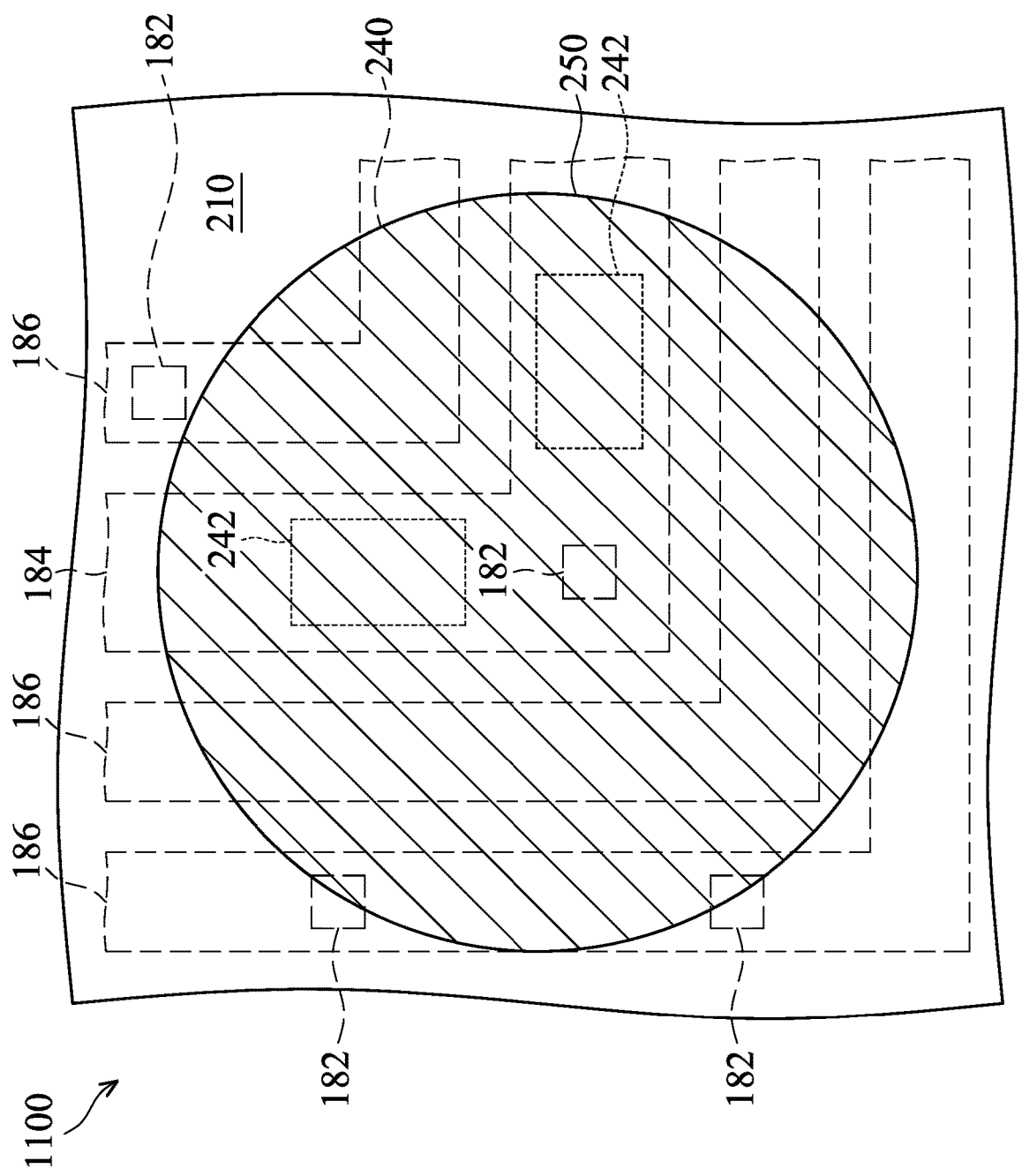
FIG. 11 is a top view of a chip structure, in accordance with some embodiments.

FIG. 11 is a top view of a chip structure 1100, in accordance with some embodiments. As shown in FIG. 11, the chip structure 1100 is similar to the chip structure 1000 of FIG. 10, except that the conductive pillar 240 has two bottom protruding portions 242, which have a straight strip shape such as a rectangle shape, in accordance with some embodiments.

Figure 12:
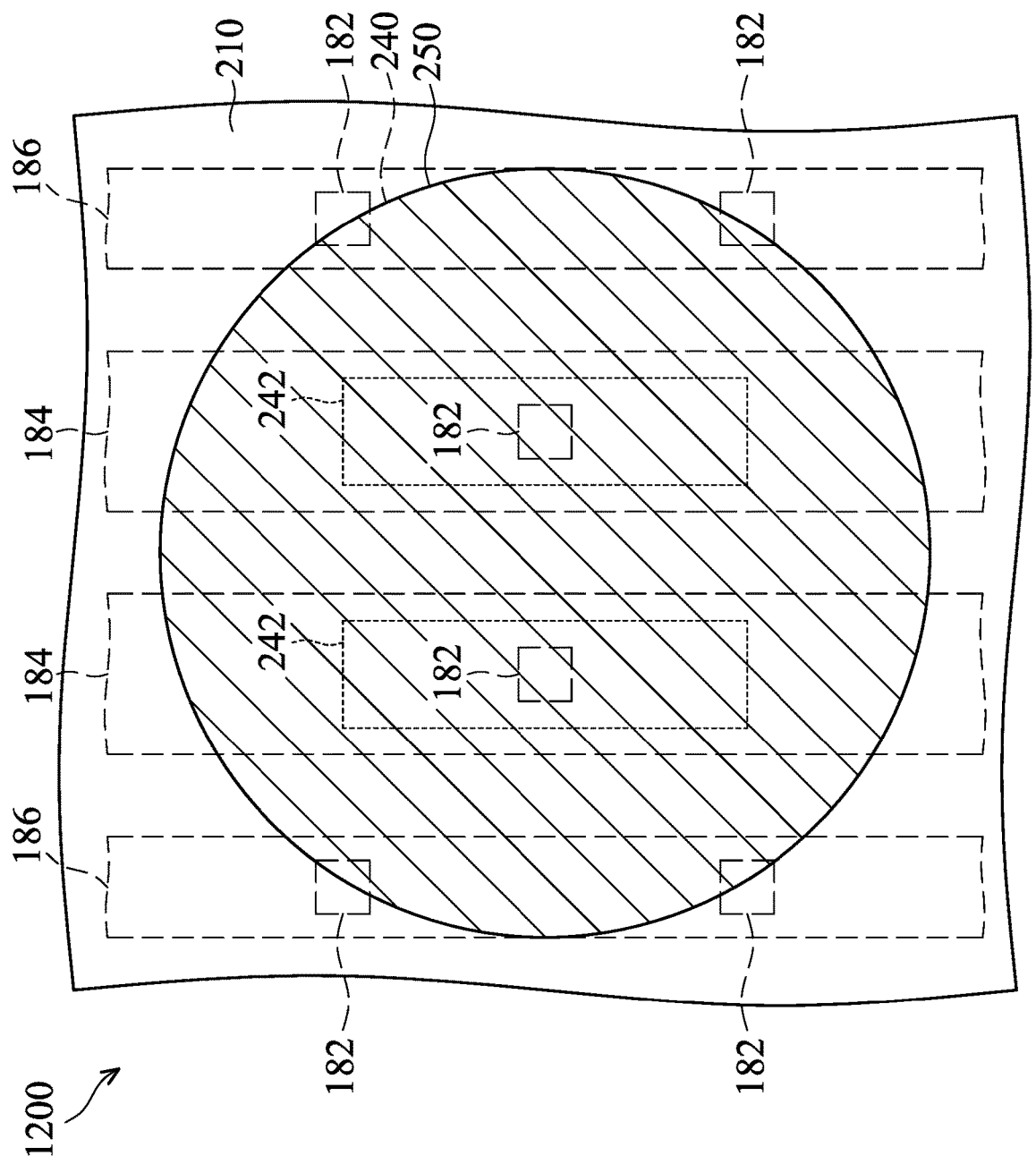
FIG. 12 is a top view of a chip structure, in accordance with some embodiments.

FIG. 12 is a top view of a chip structure 1200, in accordance with some embodiments. As shown in FIG. 12, the chip structure 1200 is similar to the chip structure 100 of FIGS. 1L and 1L-1, except that the chip structure 1200 has more than one conductive line 184 and more than one bottom protruding portion 242, in accordance with some embodiments. Specifically, the conductive pillar 240 has two bottom protruding portions 242, which are respectively connected to two conductive lines 184 thereunder, in accordance with some embodiments.

Figure 13A:
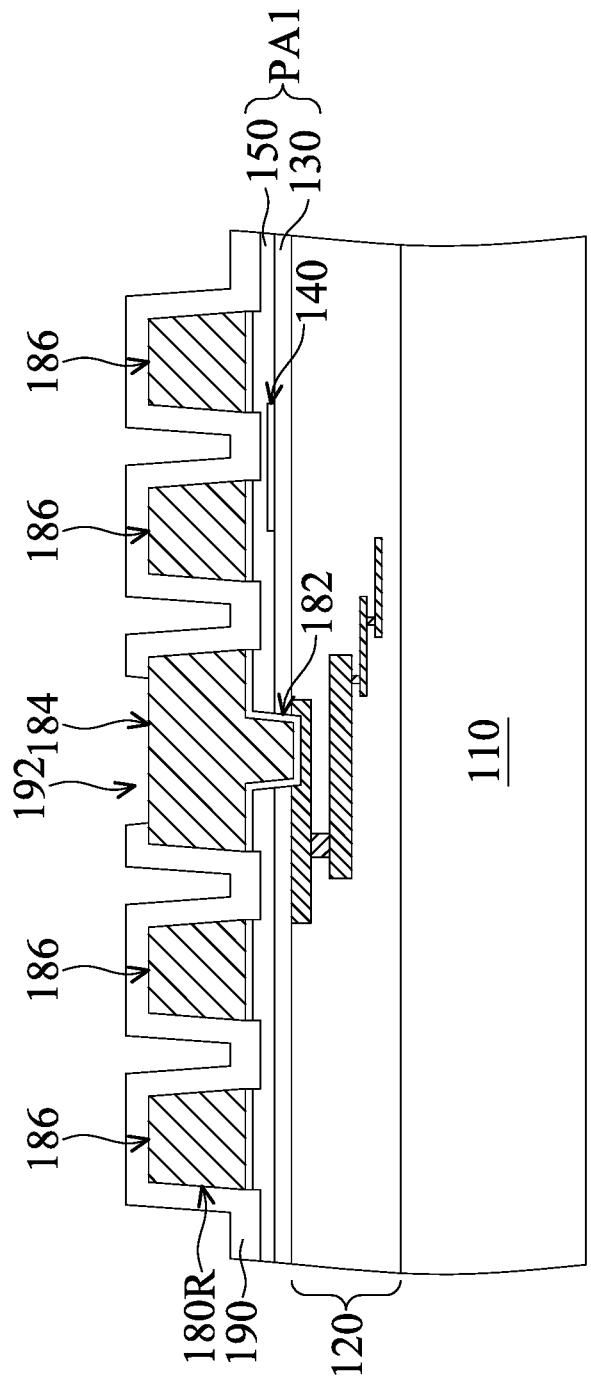
FIGS. 13A-13D are cross-sectional views of various stages of a process for forming a chip structure, in accordance with some embodiments.

FIGS. 13A-13D are cross-sectional views of various stages of a process for forming a chip structure 1300, in accordance with some embodiments. As shown in FIG. 13A, after the step of the formation of the passivation layer 190 of FIG. 1H, a portion of the passivation layer 190 is removed to form an opening 192 in the passivation layer 190, in accordance with some embodiments. The opening 192 exposes a portion of the conductive line 184, in accordance with some embodiments. The removal process includes a photolithography process and an etching process (e.g., a dry etching process), in accordance with some embodiments.

Figure 13B:
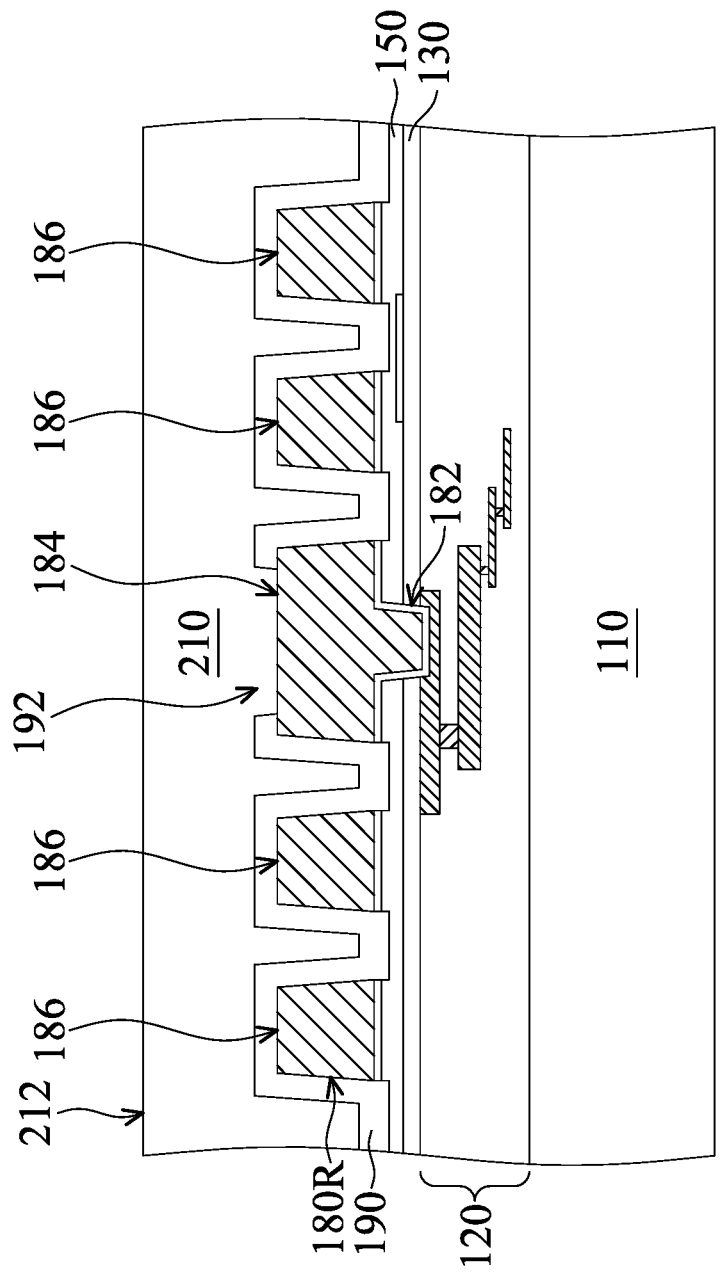

As shown in FIG. 13B, an insulating layer 210 is formed over the passivation layer 190, in accordance with some embodiments. The opening 192 is filled with the insulating layer 210, in accordance with some embodiments. The insulating layer 210 has a substantially flat top surface 212, in accordance with some embodiments.

Figure 13C:
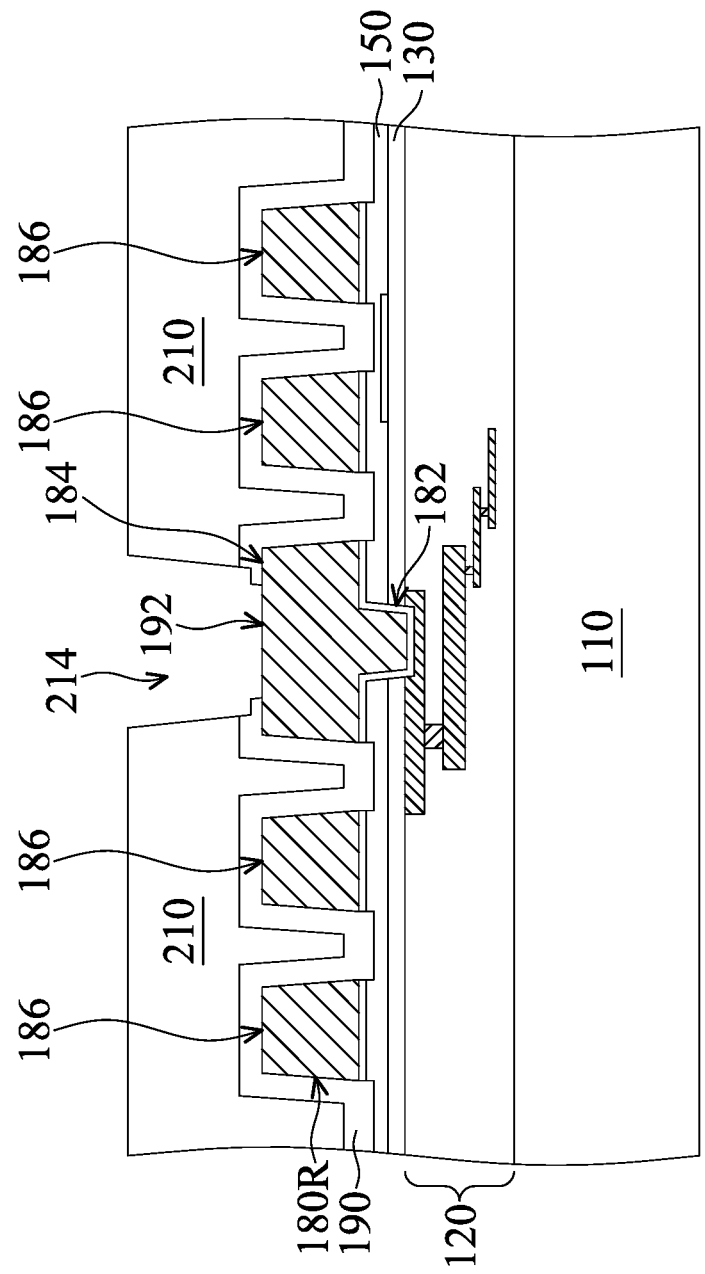

As shown in FIG. 13C, a portion of the insulating layer 210 is removed to form an opening 214 in the insulating layer 210 and communicating with the opening 192 thereunder, in accordance with some embodiments. The removal process further removes a portion of the passivation layer 190 under the opening 214, in accordance with some embodiments. The opening 214 is wider than the opening 192, in accordance with some embodiments. The removal process includes a photolithography process and an etching process (e.g., a dry etching process), in accordance with some embodiments.

Figure 13D:
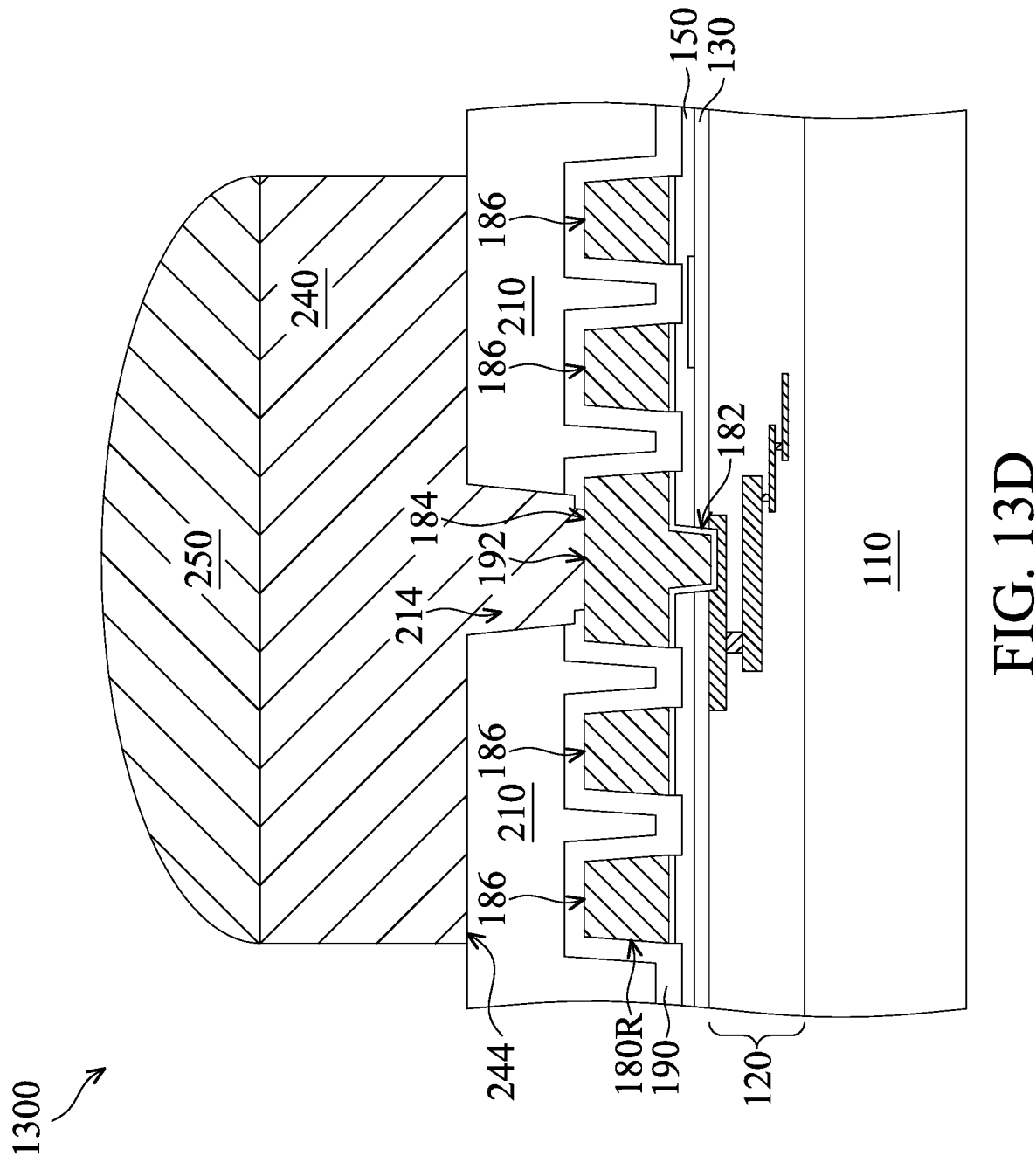

As shown in FIG. 13D, the steps of FIGS. 1J-1L are performed to form the conductive pillar 240 and the solder bump 250 over the conductive line 184 and the insulating layer 210, in accordance with some embodiments. In this step, a chip structure 1300 is substantially formed, in accordance with some embodiments.

Processes and materials for forming the semiconductor structures 200, 300, 400, 500, 600, 700, 800, 900, 1000, 1100, 1200 and 1300 may be similar to, or the same as, those for forming the semiconductor structure 100 described above.

In accordance with some embodiments, chip structures and methods for forming the same are provided. The methods (for forming the chip structure) form a conductive pillar directly on a conductive line, not a conductive pad, to reserve more space under the conductive pillar for wiring layout.

In accordance with some embodiments, a chip structure is provided. The chip structure includes a substrate. The chip structure includes a first conductive line over the substrate. The chip structure includes an insulating layer over the substrate and the first conductive line. The chip structure includes a conductive pillar over and passing through the insulating layer. The conductive pillar is formed in one piece, the conductive pillar is in direct contact with the first conductive line, and a first sidewall of the first conductive line extends across a second sidewall of the conductive pillar in a top view of the first conductive line and the conductive pillar. The chip structure includes a solder bump on the conductive pillar. The solder bump is in direct contact with the conductive pillar.

In accordance with some embodiments, a chip structure is provided. The chip structure includes a substrate. The chip structure includes a first conductive line and a second conductive line over the substrate and laterally spaced apart from each other. The chip structure includes a conductive pillar over the first conductive line and the second conductive line. The conductive pillar is formed in one piece, and the conductive pillar is in direct contact with the first conductive line. The chip structure includes a solder bump on the conductive pillar. The solder bump is in direct contact with the conductive pillar.

In accordance with some embodiments, a method for forming a chip structure is provided. The method includes forming a first conductive line over a substrate. The method includes forming an insulating layer over the substrate and the first conductive line. The insulating layer has a through hole exposing a first portion of the first conductive line. The method includes forming a conductive pillar over the insulating layer and in the through hole. The conductive pillar is formed in one piece, the conductive pillar is in direct contact with the first conductive line, and a first sidewall of the first conductive line extends across a second sidewall of the conductive pillar in a top view of the first conductive line and the conductive pillar. The method includes forming a solder bump on the conductive pillar. The solder bump is in direct contact with the conductive pillar.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip structure, comprising:
    a substrate;
    a first conductive line over the substrate;
    an insulating layer over the substrate and the first conductive line;
    a conductive pillar over and passing through the insulating layer, wherein the conductive pillar is formed in one piece, the conductive pillar extends to the first conductive line, a first sidewall of the first conductive line extends across a second sidewall of the conductive pillar in a top view of the first conductive line and the conductive pillar, the conductive pillar vertically overlaps a first portion of the first conductive line, a first linewidth of the first portion of the first conductive line is less than a width of the conductive pillar, and the first linewidth and the width are measured along an axis perpendicular to a first longitudinal axis of the first portion of the first conductive line; and a solder bump on the conductive pillar, wherein a bottom surface of the solder bump is substantially level with a top surface of the conductive pillar.

2. The chip structure as claimed in claim 1, wherein the conductive pillar has a lower surface and a bottom protruding portion protruding from the lower surface, the bottom protruding portion passes through the insulating layer over the first conductive line, and the bottom protruding portion has a rectangular shape in the top view of the conductive pillar and the first conductive line.

3. The chip structure as claimed in claim 2, wherein a second longitudinal axis of the bottom protruding portion is substantially parallel to the first sidewall of the first conductive line under the conductive pillar in the top view of the conductive pillar and the first conductive line.

4. The chip structure as claimed in claim 1, further comprising:
a second conductive line between the substrate and the conductive pillar, wherein the first conductive line is laterally spaced apart from the second conductive line, and the conductive pillar vertically overlaps the second conductive line.

5. The chip structure as claimed in claim 4, wherein the first linewidth of the first portion of the first conductive line is greater than a second linewidth of the second conductive line, and the second linewidth is measured along the axis perpendicular to the first longitudinal axis of the first portion of the first conductive line.

6. The chip structure as claimed in claim 5, wherein the first linewidth of the first portion of the first conductive line covered by the conductive pillar is greater than a third linewidth of a second portion of the first conductive line not covered by the conductive pillar, and the third linewidth is measured along the axis perpendicular to the first longitudinal axis of the first portion of the first conductive line.

7. The chip structure as claimed in claim 4, wherein the first conductive line under the conductive pillar is substantially parallel to the second conductive line under the conductive pillar.

8. The chip structure as claimed in claim 1, wherein the first conductive line is spaced apart from the second conductive line by a gap, the gap is filled with the insulating layer, and the insulating layer has a substantially flat top surface continuously extending across the first conductive line, the gap, and the second conductive line.

9. A chip structure, comprising:
a substrate;
a first conductive line over the substrate;
an insulating layer over the substrate and the first conductive line;
a conductive pillar over and passing through the insulating layer, wherein the conductive pillar is formed in one piece, the conductive pillar extends to the first conductive line, a first sidewall of the first conductive line extends across a second sidewall of the conductive pillar in a top view of the first conductive line and the conductive pillar, the conductive pillar vertically overlaps a first portion of the first conductive line, a first linewidth of the first portion of the first conductive line is less than a width of the conductive pillar, and the first linewidth and the width are measured along an axis perpendicular to a longitudinal axis of the first portion of the first conductive line;
a solder bump on the conductive pillar; and
a second conductive line between the substrate and the conductive pillar, wherein the conductive pillar vertically overlaps the second conductive line, the first conductive line is laterally spaced apart from the second conductive line, and a first top surface of the first conductive line is substantially level with a second top surface of the second conductive line.

10. The chip structure as claimed in claim 9, wherein the first linewidth of the first portion of the first conductive line is greater than a second linewidth of the second conductive line, and the second linewidth is measured along the axis perpendicular to the longitudinal axis of the first portion of the first conductive line.

11. The chip structure as claimed in claim 10, wherein a distance between the first conductive line and the second conductive line decreases toward the substrate.

12. The chip structure as claimed in claim 9, wherein the conductive pillar has a lower surface and a bottom protruding portion protruding from the lower surface, the bottom protruding portion passes through the insulating layer over the first conductive line, and the bottom protruding portion has four square corners in the top view of the conductive pillar and the first conductive line.

13. The chip structure as claimed in claim 9, wherein the first conductive line further has a second portion not covered by the conductive pillar, a first distance between the first portion of the first conductive line and the second conductive line is less than a second distance between the second portion and the second conductive line.

14. The chip structure as claimed in claim 13, wherein the first conductive line has a first recess and a second recess, and the second portion is between the first recess and the second recess.

15. A chip structure, comprising:
a substrate;
a first conductive line over the substrate;
an insulating layer over the substrate and the first conductive line;
a conductive pillar over and passing through the insulating layer, wherein the conductive pillar is formed in one piece, the conductive pillar extends to the first conductive line, a first sidewall of the first conductive line extends across a second sidewall of the conductive pillar in a top view of the first conductive line and the conductive pillar, the conductive pillar vertically overlaps a first portion of the first conductive line, a first linewidth of the first portion of the first conductive line is less than a width of the conductive pillar, the first linewidth and the width are measured along an axis perpendicular to a longitudinal axis of the first portion of the first conductive line, and a second portion of the insulating layer between the conductive pillar and the substrate has a comb shape in a cross-sectional view of the insulating layer; and
a solder bump on the conductive pillar, wherein a bottom surface of the solder bump is substantially level with a top surface of the conductive pillar.

16. The chip structure as claimed in claim 15, wherein the first conductive line is embedded in the second portion of the insulating layer.

17. The chip structure as claimed in claim 16, further comprising:
a second conductive line between the substrate and the conductive pillar, wherein the first conductive line is laterally spaced apart from the second conductive line, and the conductive pillar vertically overlaps the second conductive line.

18. The chip structure as claimed in claim 17, wherein the second conductive line is embedded in the second portion of the insulating layer.

19. The chip structure as claimed in claim 15, wherein the insulating layer between the first conductive line and the second conductive line has an inverted trapezoid shape.

20. The chip structure as claimed in claim 15, wherein the first conductive line further has a first recess and a second recess, the conductive pillar does not cover the first recess and the second recess, and the conductive pillar is between the first recess and the second recess.

* * * * *